(12) United States Patent
Adusumalli et al.

(10) Patent No.: US 10,826,523 B2
(45) Date of Patent: Nov. 3, 2020

(54) ANALOG-TO-DIGITAL CONVERTER, MEASUREMENT ARRANGEMENT AND METHOD FOR ANALOG-TO-DIGITAL CONVERSION

(71) Applicant: ams AG, Premstaetten (AT)

(72) Inventors: Ravi Kumar Adusumalli, Secunderabad (IN); Sudhakar Singamala, Hyderabad (IN); Veeresh Babu Vulligaddala, Hyderabad (IN); Rohit Ranganathan, Hyderabad (IN); Chandra Nyshadham, Pithapuram (IN); Krishna Kanth Avalur, Hyderabad (IN); Parvathy Sasikala Jayachandran Pillai, Kerela (IN)

(73) Assignee: ams AG, Premstaetten (AT)

( * ) Notice: Subject to any disclaimer, the term of this patent is extended or adjusted under 35 U.S.C. 154(b) by 0 days.

(21) Appl. No.: 16/611,118

(22) PCT Filed: May 4, 2018

(86) PCT No.: PCT/EP2018/061532
§ 371 (c)(1),
(2) Date: Nov. 5, 2019

(87) PCT Pub. No.: WO2018/206438
PCT Pub. Date: Nov. 15, 2018

(65) Prior Publication Data
US 2020/0083901 A1 Mar. 12, 2020

(30) Foreign Application Priority Data

May 9, 2017 (EP) .................................... 17170073

(51) Int. Cl.
*H03M 3/00* (2006.01)
*G01R 31/396* (2019.01)
(Continued)

(52) U.S. Cl.
CPC .......... *H03M 3/496* (2013.01); *G01R 31/382* (2019.01); *G01R 31/396* (2019.01); *H03M 1/1245* (2013.01); *H03F 3/45475* (2013.01)

(58) Field of Classification Search
CPC .. H03M 3/496; H03M 1/1245; H03M 1/1295; G01R 31/396; G01R 31/382;
(Continued)

(56) References Cited

U.S. PATENT DOCUMENTS 6,445,331 B1 * 9/2002 Stegers ................ G06G 7/1865
327/337
6,972,705 B1 * 12/2005 Fei .......................... H03M 3/39
341/143

(Continued)

FOREIGN PATENT DOCUMENTS

EP       1257053     11/2002
WO       01/28103    4/2001
(Continued)

OTHER PUBLICATIONS

European Patent Office, International Search Report for PCT/EP2018/061532 dated Jul. 5, 2018.

*Primary Examiner* — Khai M Nguyen
(74) *Attorney, Agent, or Firm* — Fish & Richardson P.C.

(57) ABSTRACT

An analog-to-digital converter (10) comprises a first and a second sampling capacitor (24, 25), a first integrator (26), a first and a second input switch (31, 32) coupling a first input terminal (11) and a common mode terminal (39) to a first electrode of the first sampling capacitor (24), a third and a fourth input switch (33, 34) coupling a second input terminal (12) and the common mode terminal (39) to a first electrode of the second sampling capacitor (25), a fifth and a sixth input switch (35, 36) coupling a second electrode of the first sampling capacitor (24) to an amplifier common mode terminal (40) and the first integrator input (27), and a (Continued)

seventh and an eighth input switch (37, 38) coupling a second electrode of the second sampling capacitor (25) to the amplifier common mode terminal (40) and the second integrator input (28).

16 Claims, 14 Drawing Sheets

(51) Int. Cl.
*G01R 31/382* (2019.01)
*H03M 1/12* (2006.01)
*H03F 3/45* (2006.01)

(58) Field of Classification Search
CPC ........... H03F 3/45475; H03F 2200/261; H03F 2203/45138; H03F 2203/45514; H03F 2203/45551; H03F 2203/45586; H03F 3/45928; B60L 58/22
USPC .................................................. 341/143, 155
See application file for complete search history.

(56) References Cited

U.S. PATENT DOCUMENTS

| | | | |
|---|---|---|---|
| 7,633,317 | B2 | 12/2009 | Miranda et al. |
| 7,671,677 | B2 | 3/2010 | Kindt et al. |
| 7,724,063 | B1 | 5/2010 | Chang et al. |
| 8,198,937 | B1 | 6/2012 | Vilas Boas et al. |
| 8,299,837 | B1 | 10/2012 | Lin |
| 2002/0180418 | A1 | 12/2002 | Jones et al. |
| 2006/0284678 | A1 | 12/2006 | Dillon |
| 2007/0120595 | A1 | 5/2007 | Udupa et al. |
| 2012/0139545 | A1 | 6/2012 | Makihira |
| 2014/0293272 | A1 | 10/2014 | Xu |
| 2015/0153422 | A1 | 6/2015 | Honda et al. |

FOREIGN PATENT DOCUMENTS

| | | |
|---|---|---|
| WO | 2010/000635 | 1/2010 |
| WO | 2015/183740 | 12/2015 |

\* cited by examiner

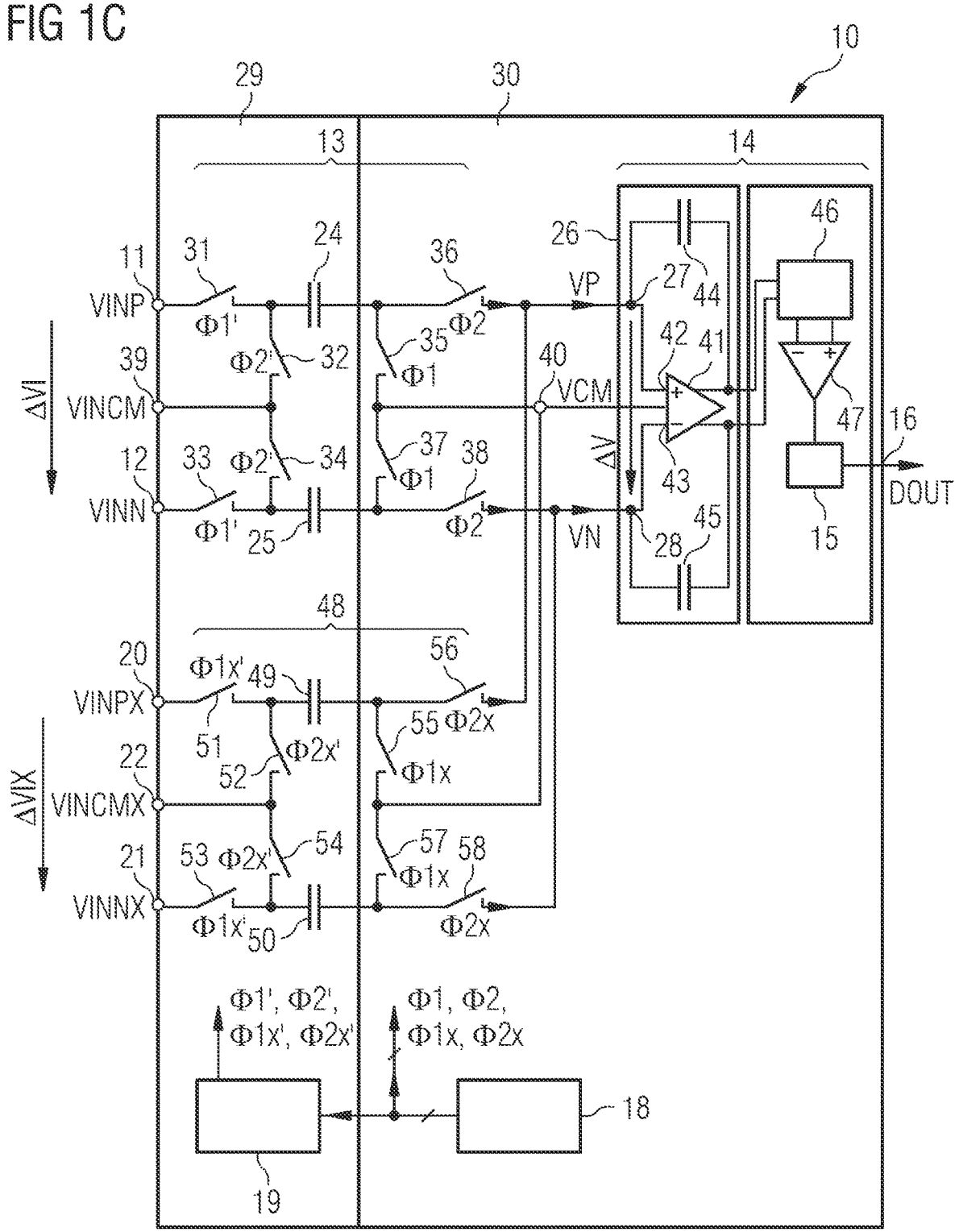

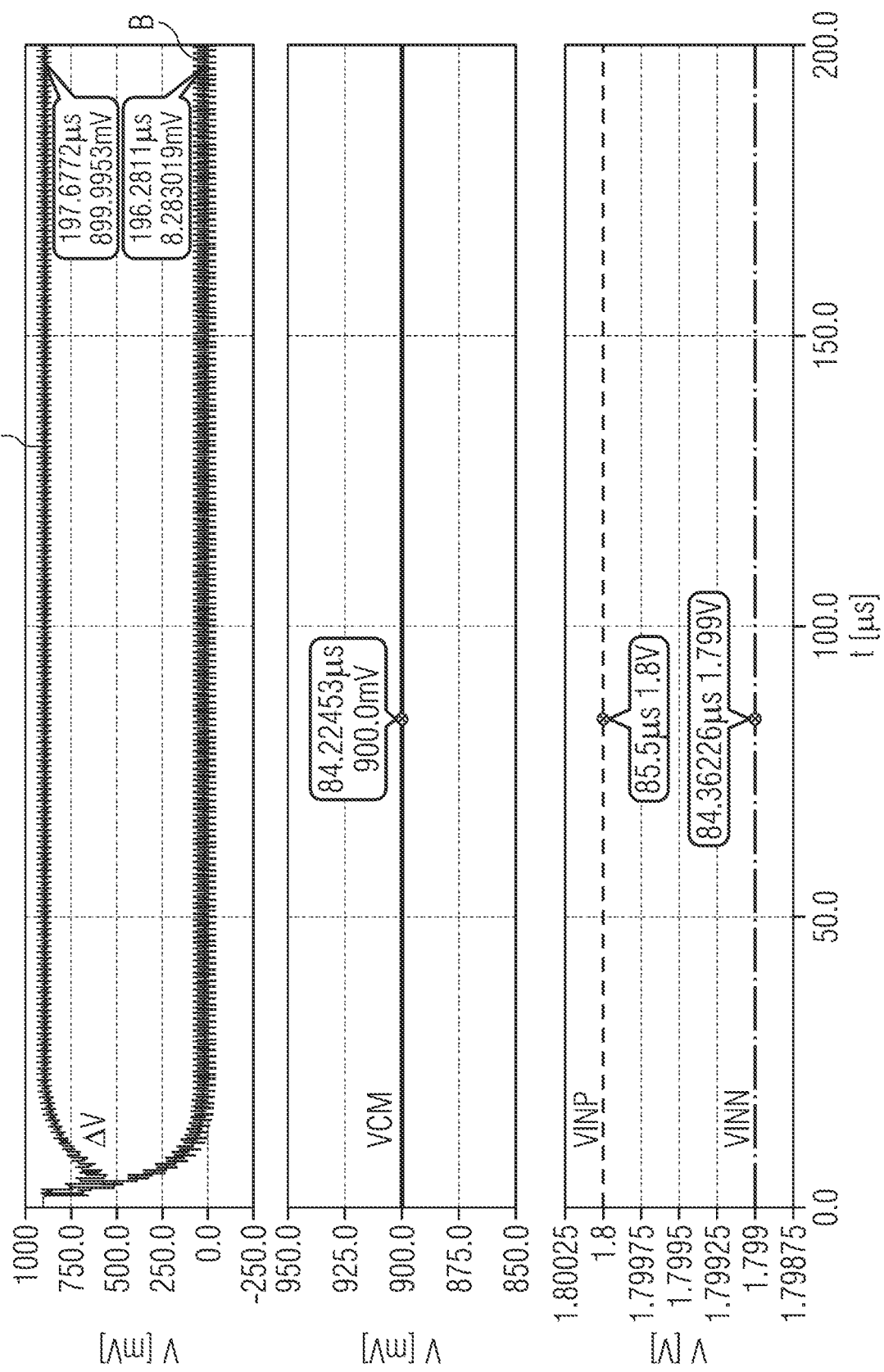

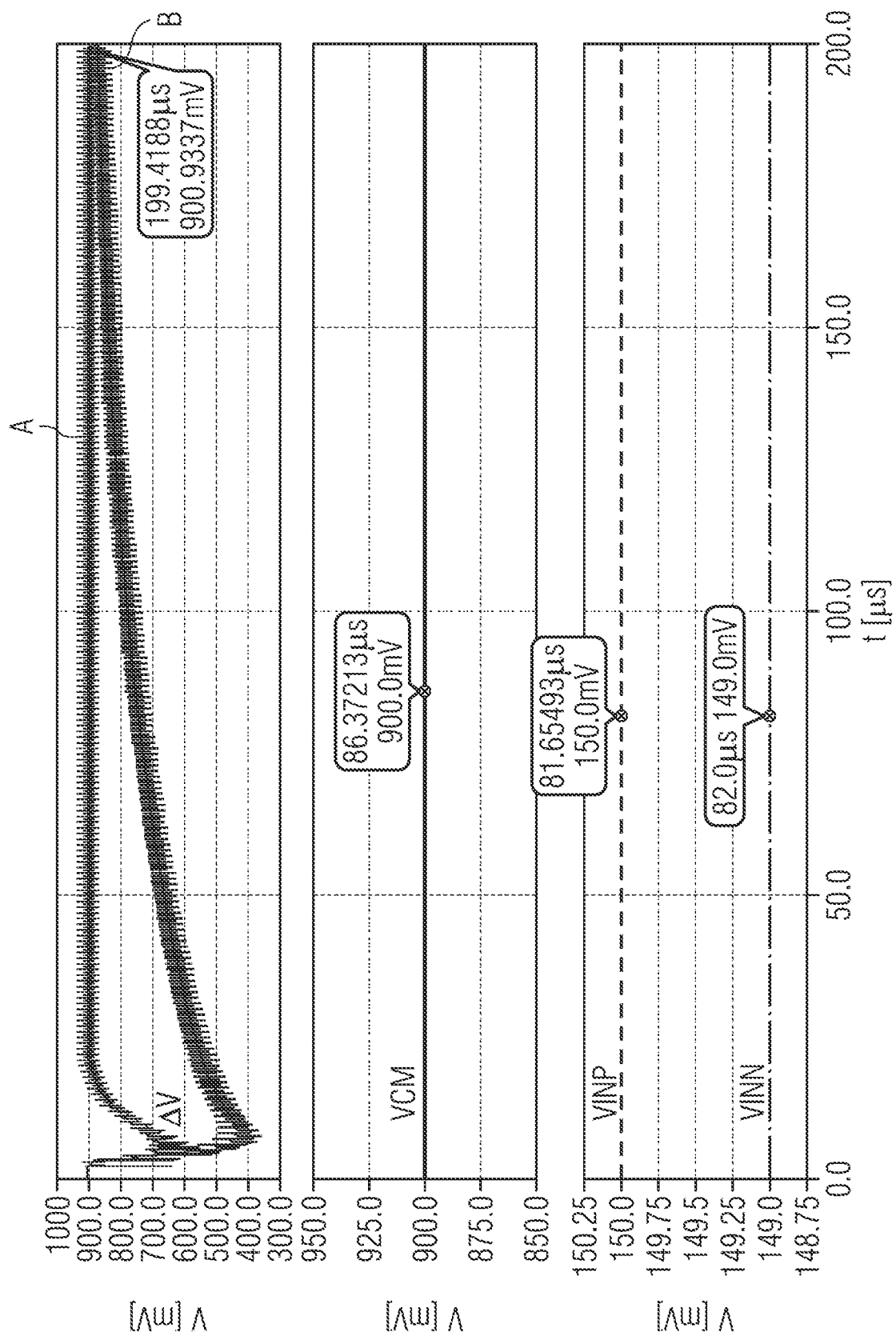

ANALOG-TO-DIGITAL CONVERTER, MEASUREMENT ARRANGEMENT AND METHOD FOR ANALOG-TO-DIGITAL CONVERSION

CROSS-REFERENCE TO RELATED APPLICATIONS

The present application is the national stage entry of International Patent Application No. PCT/EP2018/061532, filed on May 4, 2018, which claims the benefit of priority of European Patent Application No. 17170073.5, filed on May 9, 2017, all of which are hereby incorporated by reference in their entirety for all purposes.

BACKGROUND OF THE INVENTION

The present patent application is related to an analog-to-digital converter, a measurement arrangement and a method for analog-to-digital conversion.

An analog-to-digital converter often digitizes a voltage into a digital output signal. The voltage can be tapped between two input terminals. In some cases, the voltages at the two input terminals are high and only a small difference has to be converted into the digital output signal.

SUMMARY OF THE INVENTION

In an embodiment, an analog-to-digital converter comprises a first and a second sampling capacitor and a first integrator having a first and a second integrator input. Moreover, the analog-to-digital converter comprises a first input switch that couples a first input terminal to a first electrode of the first sampling capacitor, a second input switch that couples a common mode terminal to the first electrode of the first sampling capacitor, a third input switch that couples a second input terminal to a first electrode of the second sampling capacitor, and a fourth input switch that couples the common mode terminal to the first electrode of the second sampling capacitor. Furthermore, the analog-to-digital converter comprises a fifth input switch that couples a second electrode of the first sampling capacitor to an amplifier common mode terminal, a sixth input switch that couples the second electrode of the first sampling capacitor to the first integrator input, a seventh input switch that couples a second electrode of the second sampling capacitor to the amplifier common mode terminal, and an eighth input switch that couples the second electrode of the second sampling capacitor to the second integrator input.

Advantageously, a reduction of the absolute values of the voltages at the first and the second input terminal with respect to the values of the voltages at the first and the second integrator input results from the two sampling capacitors and the eight input switches. The analog-to-digital converter is abbreviated AD converter.

In an embodiment, the common mode terminal is not directly connected to the amplifier common mode terminal.

In an embodiment, the first integrator comprises an amplifier having a first amplifier input connected to the first integrator input and a second amplifier input connected to the second integrator input, a first integrating capacitor coupled to the first amplifier input and to a first amplifier output of the amplifier, and a second integrating capacitor coupled to the second amplifier input and to a second amplifier output of the amplifier.

In an embodiment, the amplifier is connected to the amplifier common mode terminal. An amplifier common mode voltage is tapped at the amplifier common mode terminal. The AD converter may comprise a reference voltage source connected to the amplifier common mode terminal. The reference voltage source may generate the amplifier common mode voltage.

In an embodiment, the AD converter comprises a second integrator coupled on its input side to the first and the second amplifier output and a comparator coupled on its input side to an output side of the second integrator. A filter of the AD converter is coupled on its input side to the output side of the second integrator.

In an embodiment, the AD converter is configured as a sigma-delta modulator, abbreviated SDM.

In an embodiment, the AD converter comprises a first clock generator having a first output connected to the fifth and the seventh input switch and a second output connected to the sixth and the eighth input switch. A second clock generator of the AD converter comprises a first output connected to the first input switch and a second output connected to the second input switch. The first output of the second clock generator may additionally be connected to the third input switch. The second output of the second clock generator may additionally be connected to the fourth input switch.

In an embodiment, the first and the second clock generator are coupled such that the first, third, fifth and seventh input switch receive a first logical signal and the second, fourth, sixth and eighth input switch receive a second logical signal.

In an embodiment, the AD converter comprises a sampling circuit that comprises the first and the second sampling capacitor and the first to the eighth input switch.

In an embodiment, the AD converter comprises a further sampling circuit. The further sampling circuit comprises a further first and a further second sampling capacitor and a further first to a further eighth input switch. The sampling circuit and the further sampling circuit are both connected to the first and the second integrator input.

In an embodiment, the first to the fourth input switch, the first and the second sampling capacitor and the second clock generator are configured to operate at a higher voltage level than the fifth to the eighth input switch and the first clock generator. The voltage level at which the first to the fourth input switch, the first and the second sampling capacitor and the second clock generator operate is e.g. the sensing voltage level that means the level of the voltages that can be tapped at the first and the second input terminal. In an example, the voltage level can go as high as 120 V. For example, the first to the fourth input switch, the first and the second sampling capacitor and the second clock generator operate at voltages from 5 V to 120 V, whereas the fifth to the eighth input switch and the first clock generator operate at voltages up to 5 V. Alternatively, the first to the fourth input switch, the first and the second sampling capacitor and the second clock generator operate at voltages from 1.8 V to 120 V, whereas the fifth to the eighth input switch and the first clock generator operate at voltages up to 1.8 V. Alternatively, the first to the fourth input switch, the first and the second sampling capacitor and the second clock generator operate at voltages from 3.3 V to 120 V, whereas the fifth to the eighth input switch and the first clock generator operate at voltages up to 3.3 V.

In an embodiment, the second clock generator comprises an input stage connected on its input side to a first input of the second clock generator, an intermediate stage and an output stage connected on its output side to the first output of the second clock generator. The intermediate stage couples the input stage to the output stage. The first input of the second clock generator may be connected to the first output of the first clock generator.

In an embodiment, the first output of the second clock generator is connected to the control terminal of the first input switch. A first supply terminal of the output stage may be coupled to the first input terminal. A first input voltage is provided to the first input terminal and thus to the first supply terminal of the output stage. The output stage may comprise a first pull-up resistor that couples the first supply terminal to the first output of the second clock generator. The output stage may comprise at least one output transistor coupling the first output of the second clock generator to a reference potential terminal and being controlled by the intermediate stage.

In an embodiment, an additional first output of the second clock generator is connected to the control terminal of the third input switch. The output stage is connected on its output side to the additional first output of the second clock generator. A second supply terminal of the output stage may be coupled to the second input terminal. A second input voltage is provided to the second input terminal and thus to the second supply terminal of the output stage. The output stage comprises a second pull-up resistor that couples the second supply terminal to the additional first output of the second clock generator. The output stage may comprise at least one further output transistor coupling the additional first output of the second clock generator to the reference potential terminal and being controlled by the intermediate stage.

In an embodiment, an input common mode voltage is tapped at the common mode terminal. The input common mode voltage and the amplifier common mode voltage have different values. The input common mode voltage and the amplifier common mode voltage are independent from each other. A change of the input common mode voltage does not result in a change of the amplifier common mode voltage.

In an embodiment, the AD converter comprises a resistive voltage divider having a first resistor coupling the first input terminal to the common mode terminal and a second resistor coupling the common mode terminal to the second input terminal. Thus, the AD converter may be configured to generate the input common mode voltage itself by the resistive voltage divider.

In an embodiment, the resistive voltage divider comprises at least one switch of a divider switch being arranged in series to the first resistor and a further divider switch being arranged in series to the second resistor.

In an embodiment, a measurement arrangement comprises the AD converter, a first cell and a coupler coupling a first terminal of the first cell to the first input terminal and a second terminal of the first cell to the second input terminal. A battery may comprise the first cell.

In an embodiment, the measurement arrangement comprises at least a second cell. The coupler selectively couples the first terminal of the first cell to the first input terminal and the second terminal of the first cell to the second input terminal or a first terminal of the second cell to the first input terminal and a second terminal of the second cell to the second input terminal. The coupler receives a control signal with the information which cell has to be connected to the AD converter. The measurement arrangement is configured to determine a first voltage of the first cell and a second voltage of the second cell. The battery may comprise the first and the second cell.

In an embodiment, a measurement arrangement comprises the AD converter and a resistive sensor having a first terminal connected to the first input terminal and a second terminal connected to the second input terminal.

In an embodiment, the resistive sensor has a tap that is connected to the common mode terminal. The resistive sensor may comprise a first and a second resistive element. The first resistive element may couple the first terminal to the tap of the resistive sensor. The second resistive element may couple the tap to the second terminal of the resistive sensor. Thus, the resistive sensor may be configured to generate the input common mode voltage. Therefore, the AD converter may be free of a resistive voltage divider or another circuit for generating the input common mode voltage.

In an embodiment, an AD converter comprises a first integrator having a first and a second integrator input, and a sampling arrangement. The sampling arrangement couples a first input terminal, a second input terminal, and a common mode terminal that are connected to an input side of the sampling arrangement to a first integrator input, a second integrator input and an amplifier common mode terminal that are connected to the output side of the sampling arrangement. The sampling arrangement may comprise a first and a second sampling capacitor and a first to an eighth input switch.

In an embodiment, a method for analog-to-digital conversion comprises, in a first phase, to sample a first difference between a first input voltage and an amplifier common mode voltage by a first sampling capacitor and to sample a second difference between a second input voltage and the amplifier common mode voltage by a second sampling capacitor. In a second phase, a first integrator voltage is provided to a first integrator input of a first integrator by subtracting the first difference voltage from an input common mode voltage and a second integrator voltage is provided to a second integrator input of the first integrator by subtracting the second difference voltage from the input common mode voltage. Moreover, a digital output value is generated by digitizing an integrator difference voltage between the first integrator voltage and the second integrator voltage.

In an embodiment, the AD converter performs the method for analog-to-digital conversion. The method for analog-to-digital conversion is implemented as a high common mode bi-directional direct digital conversion with input signal common mode sampling. The AD converter relates to the field of building a wide (high-side and low side) common mode input current/resistive sensing measurement with direct digital conversion with fast throughput, signal common-mode settling requirements and relaxed ADC amplifier input-stage common-mode requirements.

In an embodiment, a resistive voltage divider generates the input common mode voltage out of the first and the second input voltage. The first input voltage is provided to a first input terminal. The second input voltage is applied to a second input terminal. The resistive voltage divider couples the first input terminal to the second input terminal. The input common mode voltage is tapped at a common mode terminal. A tap of the resistive voltage divider is connected to the common mode terminal. Thus, the input common mode voltage is tapped at a tap of the resistive voltage divider.

Advantageously, the input common mode voltage has a voltage value between the first input voltage and the second input voltage, since the input common mode voltage is generated using the first and the second input voltage. Thus, a voltage drop across a first to a fourth input switch is kept low even if an absolute value of the first or the second input voltage is high. Advantageously, the resistive voltage divider is simple to realize for any value of the input common mode voltage that has to be generated. Since one can design large or small resistors, there is a high flexibility for the design of the resistive voltage divider.

BRIEF DESCRIPTION OF THE DRAWINGS

The following description of figures of exemplary embodiments may further illustrate and explain aspects of the patent application. Devices and circuit parts with the same structure and the same effect, respectively, appear with equivalent reference symbols. In so far as devices or circuit parts correspond to one another in terms of their function in different figures, the description thereof is not repeated for each of the following figures.

FIGS. 1A to 1D show exemplary embodiments of an AD converter.

FIGS. 5A to 5D show exemplary embodiments of signal characteristics of a measurement arrangement.

DETAILED DESCRIPTION

Figure 1A:
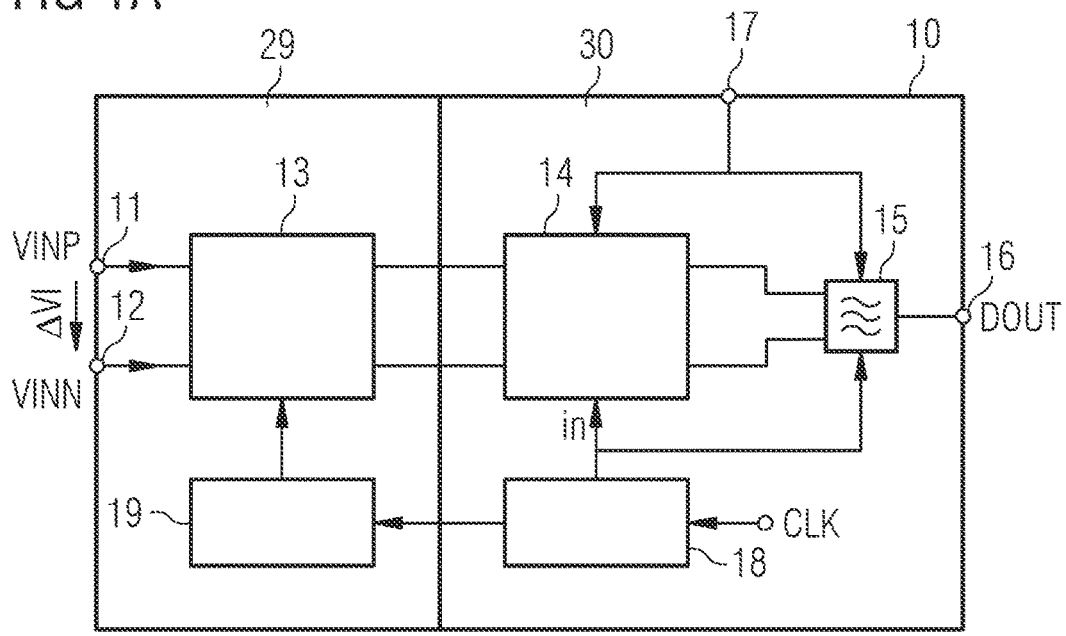

FIG. 1A shows an exemplary embodiment of an analog-to-digital converter 10, abbreviated AD converter. The AD converter 10 comprises a first and a second input terminal 11, 12. The first and the second input terminal 11, 12 may be realized as pads on a surface of a semiconductor body that comprises the AD converter 10. Moreover, the AD converter 10 comprises a sampling circuit 13 having an input side connected to the first and the second input terminal 11, 12. On an output side, the sampling circuit 13 is coupled to an input side of a switched capacitor circuit 14 of the AD converter 10. An output side of the switched capacitor circuit 14 is coupled to an input side of a filter 15 of the AD converter 10. The filter 15 may be realized as a decimation filter. The filter 15 is connected on its output side to a digital output terminal 16 that may be called data terminal. A sigma delta modulator comprises the sampling circuit 13 and the switched capacitor circuit 14. Switched capacitor is abbreviated SC.

A control terminal 17 of the AD converter 10 is connected to a control input of the SC circuit 14 and to a control input of the filter 15. The AD converter 10 is realized as a differential AD converter. Thus, the sampling circuit 13 comprises two outputs which are connected to two inputs of the SC circuit 14. Correspondingly, the SC circuit 14 has two outputs connected to two inputs of the filter 15.

The AD converter 10 comprises a first and a second clock generator 18, 19. The first clock generator 18 is connected on its output side to clock inputs of the SC circuit 14 and of the filter 15. Moreover, the first clock generator 18 is connected to an input of the second clock generator 19. The second clock generator 19 is connected on its output side to the sampling circuit 13. A clock signal CLK is provided to the first clock generator 18.

A first input voltage VINP is provided to the first input terminal 11. A second input voltage VINN is applied to the second input terminal 12. Thus, there is an input difference voltage ΔVI between the first input terminal 11 and the second input terminal 12. The input difference voltage ΔVI has the value:

ΔVI=VINP−VINN

The first and the second input voltage VINP, VINN are provided to the sampling circuit 13. The AD converter 10 generates a digital output signal DOUT that is provided at the digital output terminal 16 as a function of the first and the second input voltage VINP, VINN. The first input voltage VINP may be higher than the second input voltage VINN.

The first and the second input terminal 11, 12, the sampling circuit 13 and the second clock generator 19 are comprised by a high voltage domain 29. The first clock generator 18, the SC circuit 14 and the filter 15 are realized in a low voltage domain 30. Voltages which are as high as the sensing voltage level can be tapped in the high voltage domain 29. Voltages which are as high as the first and the second input voltage VINP, VINN can be tapped in the high voltage domain 29. A voltage in the high voltage domain 29 may be up to 120 V. The AD converter 10, as shown in FIG. 1A, may be realized on a surface of one semiconductor body. The circuit parts comprised by the high voltage domain 29 are realized using transistors and other circuit parts which can withstand a high voltage such as voltages higher e.g. 50 V. Contrary to that, the circuit parts comprised by the low voltage domain 30 are fabricated using transistors and other circuit parts that can withstand lower voltages such as up to 5 V. The first and the second input voltage VINP, VINN may obtain high values, for example higher than 10 V or 50 V which are converted by the sampling circuit 13 into lower voltage values such that the SC circuit 14 is able to operate with these voltage values.

The implementation of the AD converter 10 contains a high-voltage sampling circuit 13, a SC circuit 14 implementing a modulator such as a sigma delta modulator and a filter 15 realized as a decimator. A sigma delta modulator is abbreviated SDM. A portion of the modulator, namely the first integrator sampling SC circuit 13, works in the high voltage domain 29 and the remaining part 14 of the modulator and the decimator 15 work in the low voltage domain 30.

In an alternative, not shown embodiment, the first clock generator 18 may also be connected to the sampling circuit 13.

Figure 1B:
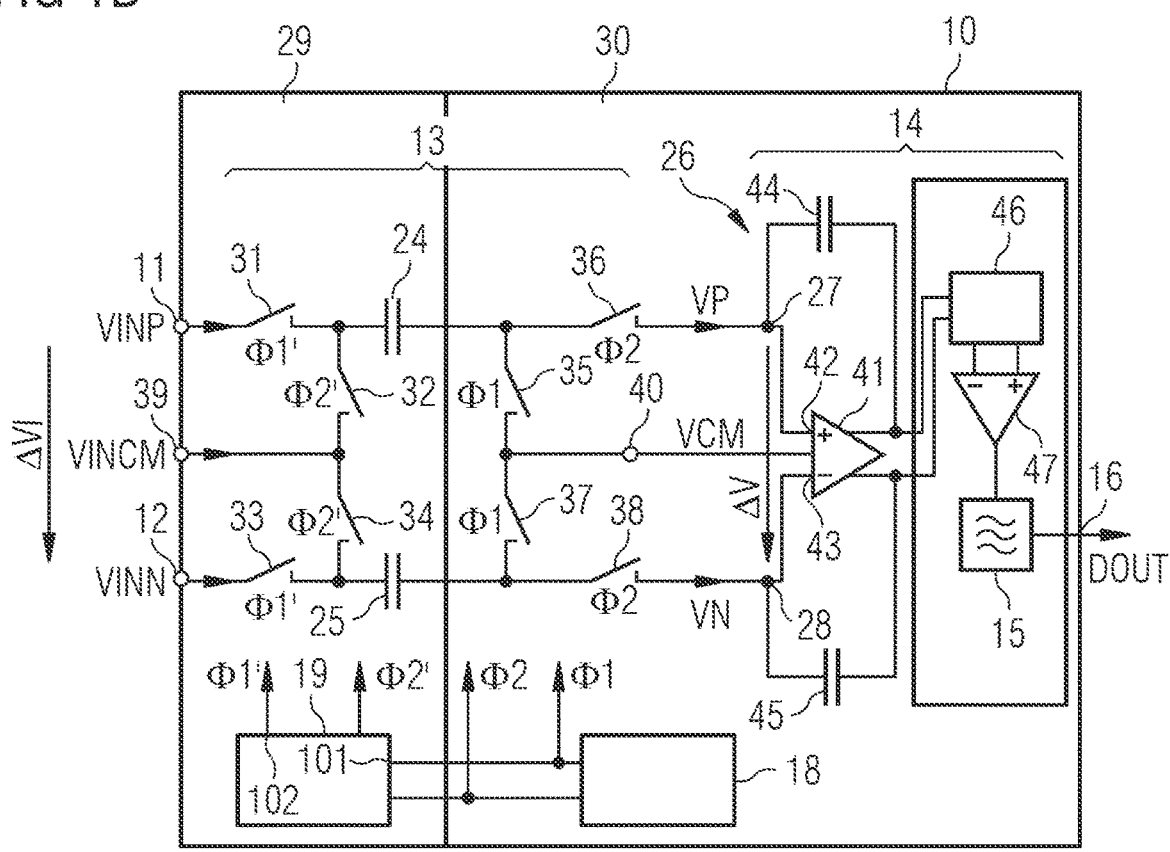

FIG. 1B shows a further exemplary embodiment of the AD converter 10 which is a further development of the embodiment shown in FIG. 1A. The AD converter 10 comprises a first and a second sampling capacitor 24, 25. The AD converter 10 comprises a first integrator 26 having a first and a second integrator input 27, 28. Moreover, the AD converter 10 comprises a first to an eighth input switch 31 to 38. A first electrode of the first sampling capacitor 24 is coupled via the first input switch 31 to the first input terminal 11 and via the second input switch 32 to a common mode terminal 39. A first electrode of the second sampling capacitor 25 is coupled via the third input switch 33 to the second input terminal 12 and via the fourth input switch 34 to the common mode terminal 39. A second electrode of the first sampling capacitor 24 is coupled via the fifth input switch 35 to an amplifier common mode terminal 40 and via the sixth input switch 36 to the first integrator input 27. Moreover, a second electrode of the second sampling capacitor 25 is coupled via the seventh input switch 37 to the amplifier common mode terminal 40 and via the eighth input switch 38 to second integrator input 28.

The first integrator 26 comprises an amplifier 41. A first amplifier input 42 of the amplifier 41 is directly connected to the first integrator input 27. A second amplifier input 43 of the amplifier 41 is directly connected to the second integrator input 28. The first amplifier input 42 is coupled via a first integrating capacitor 44 of the first integrator 26 to a first amplifier output of the amplifier 41. Correspondingly, the second amplifier input 43 is coupled via a second integrating capacitor 45 of the first integrator 26 to a second amplifier output of the amplifier 41. The first and the second integrating capacitor 44, 45 may have the same capacitance value CG. The amplifier common mode terminal 40 is also connected to an input of the amplifier 41.

The first and the second amplifier output are coupled via a first and a second output of the first integrator 26 to an input side of a second integrator 46. The second integrator 46 may be realized correspondingly to the first integrator 26. Two outputs of the second integrator 46 are coupled to the input side of a comparator 47 of the AD converter 10. The comparator 47 is coupled on its output side via the filter 15 to the output terminal 16. The AD converter 10 may comprise a feedback network, for example coupling the output side of the comparator 47 to the input side of the first and the second integrator 26, 46. The comparator 47 may be replaced by a quantizer.

The first clock generator 18 has a first output connected to control terminals of the fifth and the seventh switch 35, 37 by not shown connection lines. Moreover, a second output of the first clock generator 18 is connected to control terminals of the sixth and the eighth input switch 36, 38 by not shown connection lines. The first and the second output of the first clock generator 18 are connected to a first input 101 and a second input of the second clock generator 19. The second clock generator 19 has a first output 102 connected to control terminals of the first and the third input switch 31, 33 and a second output connected to control terminals of the second and the fourth input switch 32, 34 by not shown connection lines.

The first to the fourth input switch 31 to 34 and the first and the second sampling capacitor 24, 25 are fabricated such that they withstand higher voltage values than the fifth to the eighth input switch 35, 38 and the first integrator 26. The first and the second sampling capacitor 24, 25 have the same capacitance value CS.

An input common mode voltage VINCM can be tapped at the common mode terminal 39. An amplifier common mode voltage VCM is provided at the amplifier common mode terminal 40. The AD converter 10 may comprise a reference voltage source connected to the amplifier common mode terminal 40. The not-shown voltage source generates the amplifier common mode voltage VCM.

The input common mode voltage VINCM has a value between the first input voltage VINP and the second input voltage VINN. For example, the common mode input voltage VINCM follows the equation:

VINN≤VINCM≤VINP

Thus, the common mode terminal 39 may be connected to the first or the second input terminal 11, 12.

Alternatively, the common mode input voltage VINCM follows the equation:

VINN<VINCM<VINP

Thus, the common mode terminal 39 is not directly connected to the first input terminal 11 and is not directly connected to the second input terminal 12. As shown e.g. in FIGS. 2A, 2B and 3, the common mode terminal 39 is resistively coupled to the first and to the second input terminal 11, 12.

A first signal Φ1 is provided at the first output of the first clock generator 18. Correspondingly, a second signal Φ2 is generated at the second output of the first clock generator 18. A further first signal Φ1' is provided at the first output 102 of the second clock generator 19. A further second signal Φ2' is generated at the second output of the second clock generator 19. The first signal Φ1 and the further first signal Φ1' have the same logical value. The second signal Φ2 and the further second signal Φ2' have the same logical value. The signals Φ1', Φ2' generated by the second clock generator 19 may only have higher voltage values in comparison to the signals Φ1, Φ2 generated by the first clock generator 18.

The first signal Φ1 is provided to the control terminals of the fifth and the seventh input switch 35, 37. The second signal Φ2 is applied to the control terminals of the sixth and the eighth input switch 36, 38. Moreover, the further first signal Φ1' is applied to the control terminals of the first and the third input switch 31, 33. Additionally, the further second signal Φ2' is provided to the control terminals of the second and the fourth input switch 32, 34.

In a first phase PA, the first signal Φ1, Φ1' sets the first, the third, the fifth and the seventh input switch 31, 33, 35, 37 in a conducting state. In the first phase PA, the second signal Φ2, Φ2' sets the second, the fourth, the sixth and the eighth input switch 32, 34, 36, 38 in a non-conducting state. Thus, the first input voltage VINP is provided to the first sampling capacitor 24. A first difference ΔVP between the first input voltage VINP and the amplifier common mode voltage VCM is provided between the first and the second electrode of the first sampling capacitor 24. Correspondingly, the second input voltage VINN is provided to the second sampling capacitor 25. Thus, a second difference ΔVN between the second input voltage VINN and the amplifier common mode voltage VCM is provided between the first and the second electrode of the second sampling capacitor 25.

In a second phase PB, the second signal Φ2, Φ2' sets the second, the fourth, the sixth and the eighth input switch 32, 34, 36, 38 in a conducting state. Moreover, the first signal Φ1, Φ1' sets the first, the third, the fifth and the seventh input switch 31, 33, 35, 37 in a non-conducting state. The second phase PB follows the first phase PA. There is a non-overlap time between a pulse of the first signal Φ1 and a following pulse of the second signal Φ2. There is a further non-overlap time between a pulse of the second signal Φ2 and a following pulse of the first signal Φ1. The eight input switches 31 to 38 are in a non-conducting state in the non-overlap time and the further non-overlap time.

In the second phase PB, a first and a second integrator voltage VP, VN are generated. The first integrator voltage VP is applied to the first integrator input 27. Correspondingly, the second integrator voltage VN is applied to the second integrator input 28. The first and the second integrator voltage VP, VN can be calculated according to the following equations.

Figure 1D:
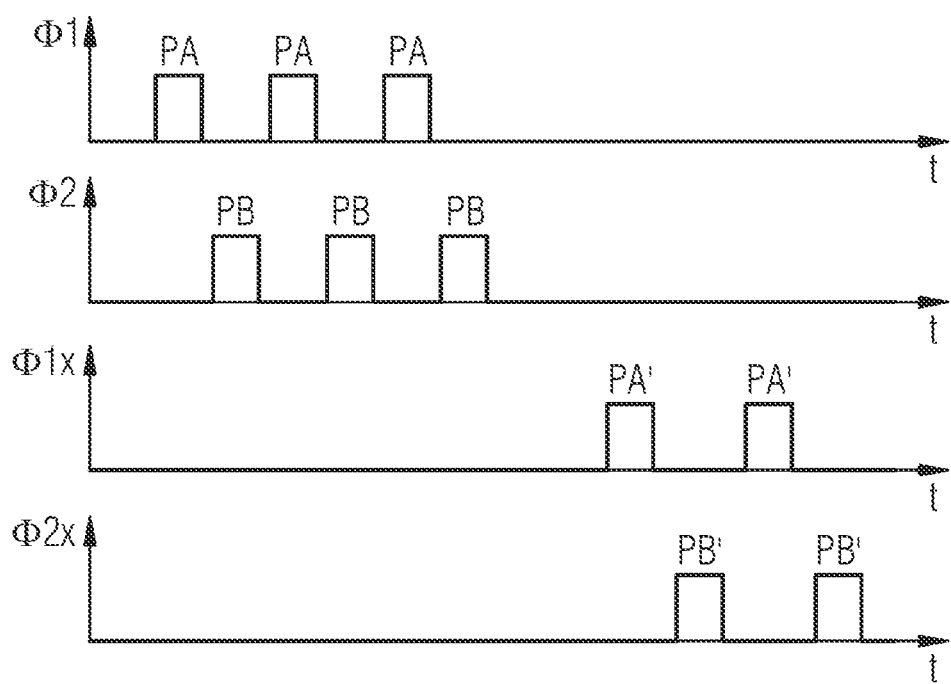

$VP = VINCM - \Delta VP = VINCM - VINP + VCM,$ $VN = VINCM - \Delta VN = VINCM - VINN + VCM$ The first and the second signal Φ1, Φ2 and the first and the second phase PA, PB are further illustrated in FIG. 1D.

An integrator difference voltage ΔV between the first and the second integrator voltage VP, VN has the same absolute value as the input difference voltage ΔVI between the first input voltage VINP and the second input voltage VINN. Advantageously, the absolute values of the first and the second integrator voltage VP, VN may be smaller than the absolute values of the first and the second input voltage VINP, VINN.

The first integrator 26 provides an output signal as a function of the first and the second integrator voltage VP, VN. This output signal is applied to the second integrator 46 that provides a signal to the input side of the comparator 47. An output signal of the comparator 47 is provided to the filter 15 which generates the digital output signal DOUT. The sigma delta modulator comprises the sampling circuit 13, the first and the second integrator 26, 46 and the comparator 47. The first and the second integrator 26, 46 and the comparator 47 are parts of the SC circuit 14.

In the high voltage domain 29, the input sampling clock phase one $\Phi 1$ and phase two $\Phi 2$ are level-shifted to sampling voltage level to sample the input voltages VINP, VINN on to the sampling capacitors 24, 25 and in the phase two $\Phi 2$ the samples voltage or sampled voltages are transferred to the output of the first integrator 26. The first integrator 26 is working on the low-voltage domain 30. The first and the second integrator 26, 46 and the corresponding clocks work on the low-voltage domain 30.

In an alternative, not shown embodiment, the AD converter 10 is free of a second integrator 46. Thus, the first integrator 26 is coupled on its output side via the comparator 47 and the filter 15 to the output terminal 16.

In an alternative, not shown embodiment, the second clock generator 19 has the first output 102 connected to the control terminal of the first input switch 31 and an additional first output 103 connected to the control terminal of the third input switch 33. The second output of the second clock generator 19 is connected to the control terminal of the second input switch 32 and an additional second output of the second clock generator 19 is connected to the control terminal of the fourth input switch 34. This embodiment will be described with FIG. 6.

FIG. 1C shows a further exemplary embodiment of the AD converter 10 which is a further development of the embodiments shown in FIGS. 1A and 1B. The AD converter 10 comprises a further sampling circuit 48 having a further first and a further second sampling capacitor 49, 50. Additionally, the further sampling circuit 48 comprises a further first to a further eighth input switch 51 to 58. The further sampling circuit 48 is realized such as the sampling circuit 13 shown in FIG. 1B. The further sampling circuit 48 is connected on its input side to a further first input terminal 20, a further second input terminal 21 and a further common mode terminal 22. The further sampling circuit 48 is connected on its output side to the first and the second integrator input 27, 28. A further first input voltage VINPX is provided to the further first input terminal 20. A further second input voltage VINNX is applied to the further second input terminal 21. A further input common mode voltage VINCMX is tapped at the further common mode terminal 22. A further input difference voltage $\Delta$VIX is the further first input voltage VINPX minus the further second input voltage VINNX.

Typically, the values of the first input voltage VINP, the second input voltage VINN and the input common mode voltage VINCM of the sampling circuit 13 are different from the values of the further first input voltage VINPX, the further second input voltage VINNX and the further input common mode voltage VINCMX of the further sampling circuit 48. The value of the amplifier common mode voltage VCM of the further sampling circuit 48 may be identical with the value of the amplifier common mode voltage VCM of the sampling circuit 13.

An additional first signal $\Phi 1X$ and an additional second signal $\Phi 2X$ are provided at additional outputs of the first clock generator 18. The additional first signal $\Phi 1X$ is applied to the control terminals of the further fifth and the further seventh input switch 55, 57. The additional second signal $\Phi 2X$ is applied to the control terminals of the further sixth and the further eighth input switch 56, 58. An additional further first signal $\Phi 1X'$ and an additional further second signal $\Phi 2X'$ are provided at an additional further first output and an additional further second output of the second clock generator 19. The additional further first signal $\Phi 1X'$ is applied to the control terminals of the further first and the further third input switch 51, 53. The additional further second signal $\Phi 2X'$ is applied to the control terminals of the further second and the further fourth input switch 52, 54. Since the sampling circuit 13 and the further sampling circuit 48 both use the same SDM, the further sampling circuit 48 is operated before or after a conversion time in which the sampling circuit 13 is operated.

The sampling circuit 13 and the further sampling circuit 48 may have different applications. For example, the sampling circuit 13 may be configured for a heater-shunt measurement. The further sampling circuit 48 may be, for example, configured for sensor measurement or sensor-X measurement. The sampling circuit 13 may be implemented as a chopper, e.g. as high voltage chopper. The further sampling circuit 48 may be implemented as a chopper, e.g. as high voltage chopper. The further sampling circuit 48 is realized in the high voltage domain 29.

The AD converter 10 shown in FIG. 1C realizes a multi-channel measurement low voltage sensor front-end strategy using a switched capacitor. The signal common-mode sampling strategy allows for rail-to-rail operation of the input stage of the sigma-delta modulator or switched-capacitor amplifier. This makes the common-mode settling response of the integrator or SC-amplifier 41 much faster and this maintains the amplifier common-mode voltage VCM of the amplifier 41 at the required voltage value. The amplifier 41 may be realized as an operational amplifier. The amplifier common-mode voltage VCM is an internally generated signal by using an analog buffer or analog buffers.

Advantages of the proposed signal sampling strategy are that the input common mode requirement for the amplifier 41 in the first stage is more relaxed for a rail-to-rail input signal range. This ensures better accuracy and linearity from the amplifier 41. Moreover, the steady state settling error of the integrator voltages VP, VN is reduced needed for high-resolution and accuracy requirements from the SDM. For an over-sampling AD converter 10 (like SDM), the output of the SDM will be more accurate even for lower over-sampling ratios, abbreviated OSR. This will in effect improve the data rate of the AD converter 10 and absolute accuracy of the AD converter 10. This approach of sampling the signal with respect to its own common-mode voltage VINCM or VINCMX helps to share the AD converter 10 for multiple sensors. The architecture shown in FIGS. 1A to 1C inherently has the capability to detect the sense element Rshunt disconnection from the supply voltage VSU or ground.

In an alternative, not shown embodiment, the further sampling circuit 48 is realized in the low voltage domain 30. The further sampling circuit 48 may be implemented as low-voltage chopper. The further first to the further eighth input switch 51 to 58 may be fabricated as n-channel metal-oxide-semiconductor transistors, abbreviated NMOS transistors.

FIG. 1D shows an exemplary embodiment of signals of the DA converter 10 as shown in FIGS. 1B and 1C. For example, first the sampling circuit 13 is used for measurement of the input difference voltage $\Delta VI$, then the further sampling circuit 48 is used for measurement of the further input difference voltage $\Delta VIX$. The pulses of the further first signals $\Phi 1'$, $\Phi 1X'$ may have higher voltage levels than the not-shown pulses of the first signals $\Phi 1$, $\Phi X$. Similarly, the pulses of the further second signals $\Phi 2'$, $\Phi 2X'$ may have higher voltage levels than the not-shown pulses of the second signals $\Phi 2$, $\Phi 2X$.

Figure 2A:
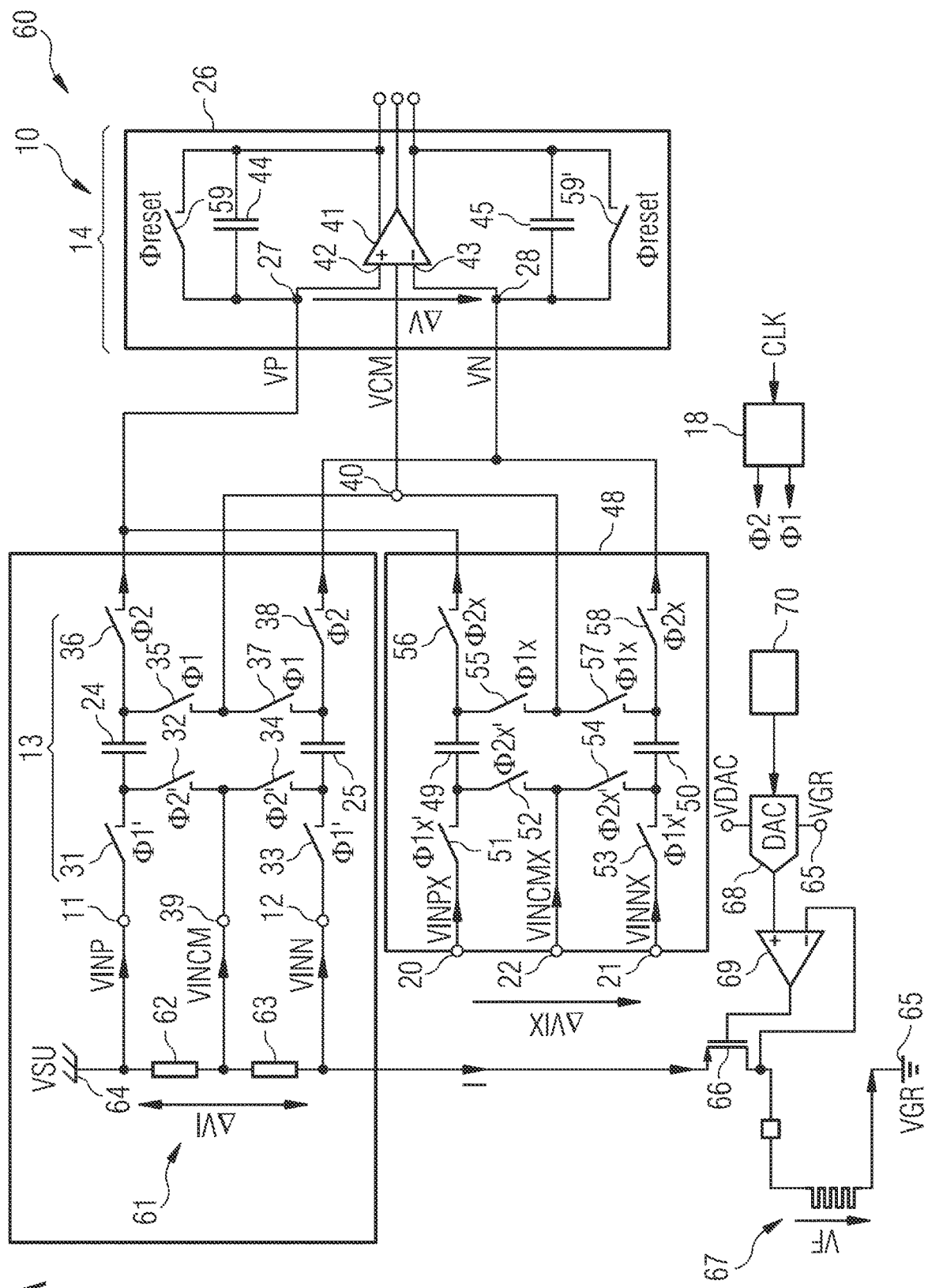
FIGS. 2A to 2C show exemplary embodiments of a measurement arrangement.

FIG. 2A shows an exemplary embodiment of a measurement arrangement 60 comprising the AD converter 10 as shown in FIGS. 1A to 1C. The first integrator 26 comprises a reset switch 59 coupling a first electrode of the first integrating capacitor 44 to a second electrode of the first integrating capacitor 44. Moreover, a further reset switch 59' of the first integrator 26 couples a first electrode of the second integrating capacitor 45 to a second electrode of the second integrating capacitor 45.

The measurement arrangement 60 comprises a resistive sensor 61. The resistive sensor 61 has a first terminal connected to the first input terminal 11 and a second terminal connected to the second input terminal 12. The resistive sensor 61 comprises a first and a second resistive element 62, 63 that are connected in series between the first terminal of the resistive sensor 61 and the second terminal of the resistive sensor 61. A tap between the first and the second resistive element 62, 63 is connected to the common mode terminal 39. The resistive sensor 39 may be realized as a shunt resistor. The resistive sensor 61 may be configured for current measurement. A resistance value of the first resistive element 62 may be approximately identical to a resistance value of the second resistive element 63.

The first terminal of the resistive sensor 61 may be connected to a supply voltage terminal 64. The second terminal of the resistive sensor 61 may be coupled to a reference potential terminal 65. The measurement arrangement 60 may comprise a transistor 66. Moreover, the measurement arrangement 60 comprises a further sensor 67. The further sensor 67 may be realized as a resistor. The further sensor 67 may be an external sensor. Thus, the further sensor 67 may be realized on another semiconductor or another body with reference to the semiconductor body comprising the AD converter 10. The further sensor 67 is connected to the reference potential terminal 65. The further sensor 67 is coupled in series to the transistor 66 and to the resistive sensor 61. Thus, the supply voltage terminal 64 is coupled via the resistive sensor 61, the transistor 66 and the further sensor 67 to the reference potential terminal 65. There may be other not-shown sensors connected to the reference potential terminal 65 in a star connection. A supply voltage VSU is tapped at the supply terminal 64.

Additionally, the measurement arrangement 60 comprises a digital-to-analog converter 68 that is coupled on its output side to a control terminal of the transistor 66. A control amplifier 69 may be coupled between the output of the digital-to-analog converter 68 and the control terminal of the transistor 66. A first input of the control amplifier 69 may be coupled to the output of the digital-to-analog converter 68. A second input of the control amplifier 69 may be coupled to a terminal of the transistor 66. An output of the control amplifier 69 may be connected to the control terminal of the transistor 66. The first input of the control amplifier 69 may be realized as a non-inverting input and the second input of the control amplifier 69 may be realized as an inverting input. The digital-to-analog converter 68 receives a further supply voltage VDAC and is connected to the reference potential terminal 65. The resistive sensor 61 is configured for the measurement of a current I flowing through the further sensor 67. The further sensor 67 may be realized as a heater.

The measurement arrangement 60 comprises a controller 70. The controller 70 may be implemented as a microcontroller or a microprocessor. The controller 70 is coupled on its output side to an input of the digital-to-analog converter 68. Moreover, the controller 70 may be coupled on its input side to the digital output terminal 16 of the AD converter 10. The resistive sensor 61, the DA converter 10, the controller 70, the digital-to-analog converter 68, the control amplifier 69 and the transistor 66 form a control loop such that the current I obtains a predetermined value. The predetermined value is set by the controller 70.

For high side measurement, the input common mode voltage VINCM of the sense element 61 is very high i.e. close to the supply voltage VSU or a high voltage based on application.

The measurement arrangement 60 is free of a voltage level shifter to reduce the input common mode voltage. Thus, the error in the measurement is reduced. The measurement arrangement 60 directly senses the current/resistance and gives the digital read-out DOUT without analog level shifting to an intermediate input common mode voltage.

The signal sampling circuit 13 operates with respect to the signal common-mode VINCM that makes the sampling more accurate and fast, thereby reducing the settling error and increasing the data-rate (throughput). The measurement arrangement 60 allows the multiplexing of the SDM AD converter 10 for signal measurements with different common-modes because the settling of the first gain stage is faster.

A direct digital readout of the sensing current I is possible for different values of the input common mode voltage VINCM ranging from zero V to the supply voltage VSU. There is no need of analog level shifting of sense signal. A level-shifting amplifier to reduce the common mode level is not required, hence it gives high accuracy in the measurement. The measurement arrangement 60 inherently has the capability to detect disconnection of the supply voltage VSU or a ground potential VGR from the resistive sensor 61. The resistive sensor 61 may be called sense element and may be realized as a shunt resistor. The ground potential VGR is tapped at the reference potential terminal.

By taking the signal mid-voltage as common-mode voltage, the settling behavior of the amplifier 41 is improved and can be used if fast throughput is required. High accuracy is achieved because the measurement arrangement 60 is free of a level-shifting amplifier to reduce the common mode level.

The implementation shown in FIG. 2A outlines the strategy to sample the voltage drop $\Delta VI$ across the shunt resistor 61 when the further sensor 67 is referred to the reference potential terminal 65. Alternatively, the measurement arrangement 60 can be configured such that the further sensor 67 is referred to the supply terminal 64 and the resistive sensor 61 is referred to the reference potential terminal 65. In both cases, a measurement of the actual current I is performed through the resistive sensor 61 using the AD converter 10.

In FIG. 2A, an application diagram for a resistive sensor front-end arrangement is shown with multi-sensor measurement strategy. A low-voltage resistive sensor measurement front-end is implemented where the sampling stage (high voltage domain 29) and the gain stage (low voltage domain 30) are low voltage components. The high voltage and the low voltage domain 29, 30 can be the same or different depending on the chip I/O supply and core supply choice. The DA converter 10 performs a measurement of the current I or a resistance through the resistive sensor 61 realizing a shunt resistor. In the sampling circuit 13 the mid-voltage VINCM of the resistive sensor 61 is used by the first integrator 26 or the switched capacitor amplifier 41.

In an alternative, not shown embodiment, the control amplifier 69 is omitted and the output of the digital-to-analog converter 68 is directly connected to the control terminal of the transistor 66.

Figure 2B:
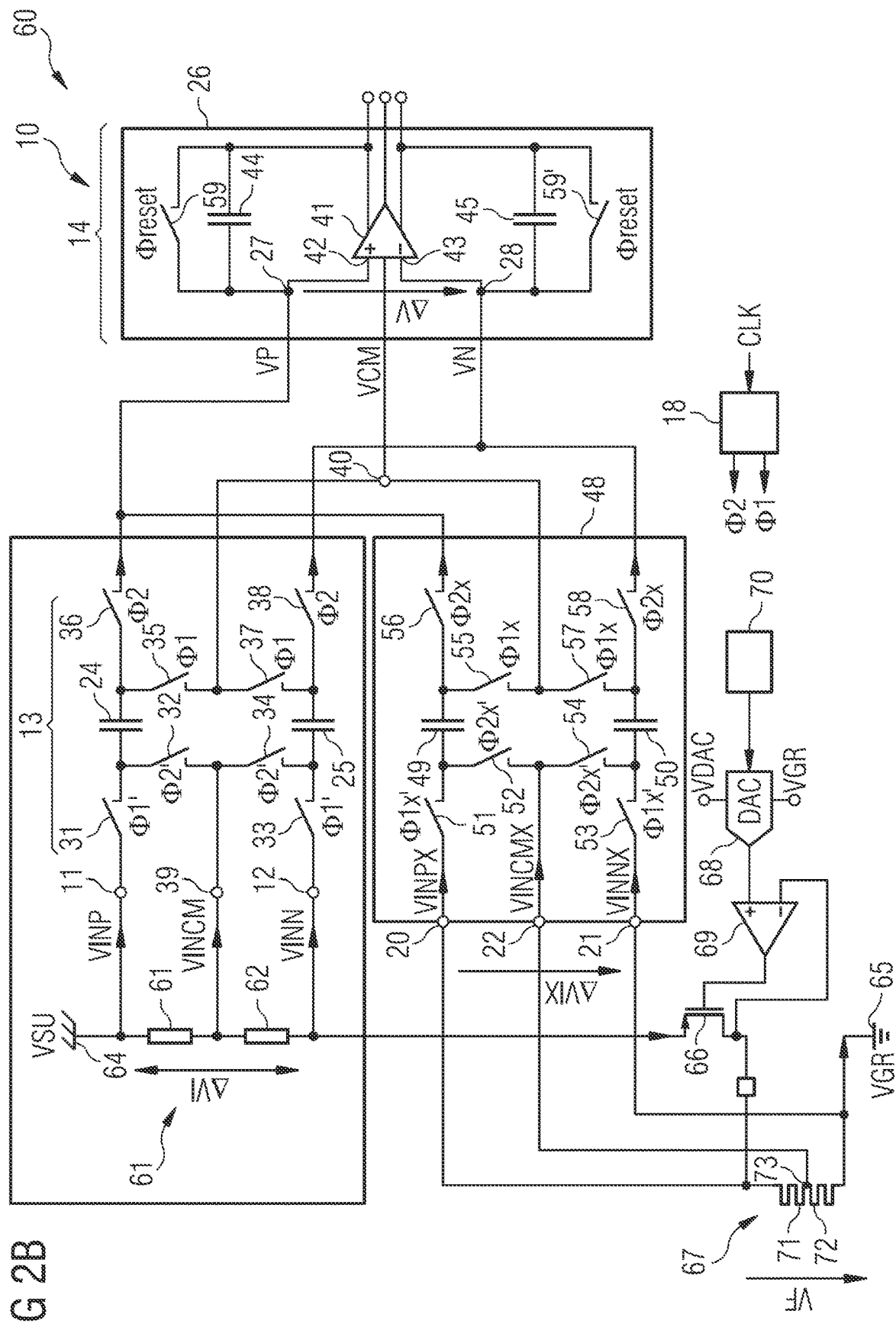

FIG. 2B shows a further exemplary embodiment of the measurement arrangement 60 which is a further development of the embodiment shown in FIG. 2A. The further first input terminal 20 of the further sampling circuit 48 is connected to a first terminal of the further sensor 67. Moreover, the further second input terminal 21 of the further sampling circuit 48 is connected to a second terminal of the further sensor 67. Thus, the further second input terminal 21 is connected to the reference potential terminal 65. The further sensor 67 comprises a first and a second resistive element 71, 72. The further sensor 67 comprises a tap 73 that is connected to the further common mode terminal 22 of the further sampling circuit 48. The tap 73 is coupled by the first resistive element 71 to the first terminal of the further sensor 67 and by the second resistive element 72 to the second terminal of the further sensor 67.

Thus, the further sampling circuit 48 is configured for the measurement of a sensor voltage VF provided across the further sensor 67. The sensor voltage VF is generated between the first and the second terminal of the further sensor 67. The sensor voltage VF is applied as the further input difference voltage ΔVIX to the further sampling circuit 48. The measurement arrangement 60 is configured to measure the current I flowing through the further sensor 67 and to measure the sensor voltage VF that is applied across the further sensor 67. Thus, the controller 70 may be configured to calculate a resistance value of the further sensor 67. The further sensor 67 may be realized for example as a gas sensor such as a metal-oxide-semiconductor gas sensor (for example a ZnO sensor or a SnO2 sensor). Such a metal-oxide-semiconductor gas sensor is heated by the current I and changes its resistance value as a function of a gas concentration such as a concentration of oxidizing or reducing gases.

Figure 2C:
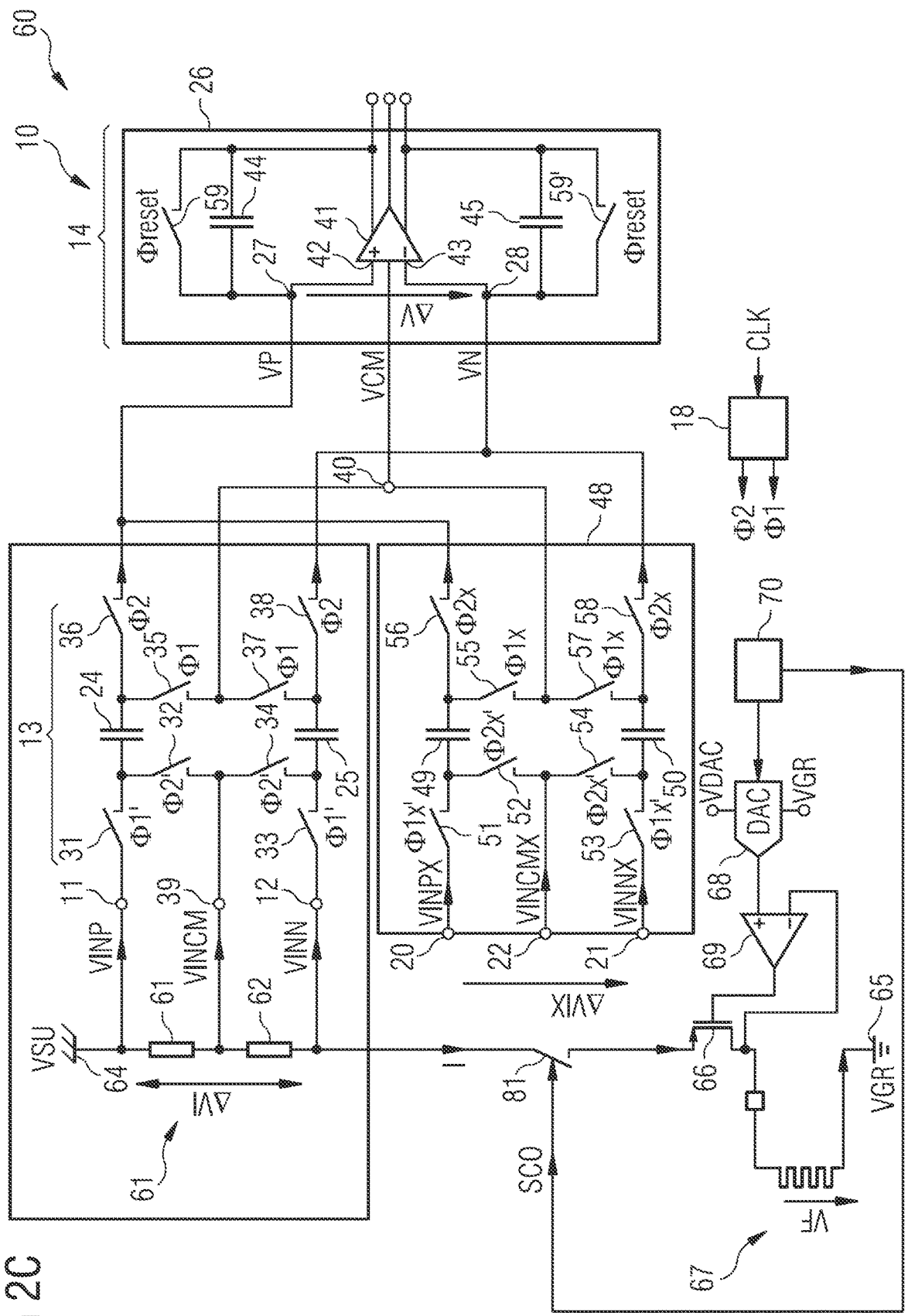

FIG. 2C shows a further exemplary embodiment of the measurement arrangement 60 which is a further development of the embodiments shown in FIGS. 2A and 2B. The measurement arrangement 60 comprises a control switch 81. The control switch 81 is arranged in the path between the resistive sensor 61 and the further sensor 67. The control switch 81 couples the resistive sensor 61 to the transistor 66. The controller 70 may be connected to a control terminal of the switch 81. The controller 70 may provide a control signal SCO to the control terminal of the control switch 81. When the controller 70 sets the control switch 81 in a non-conducting state, the current I is interrupted.

Figure 3A:
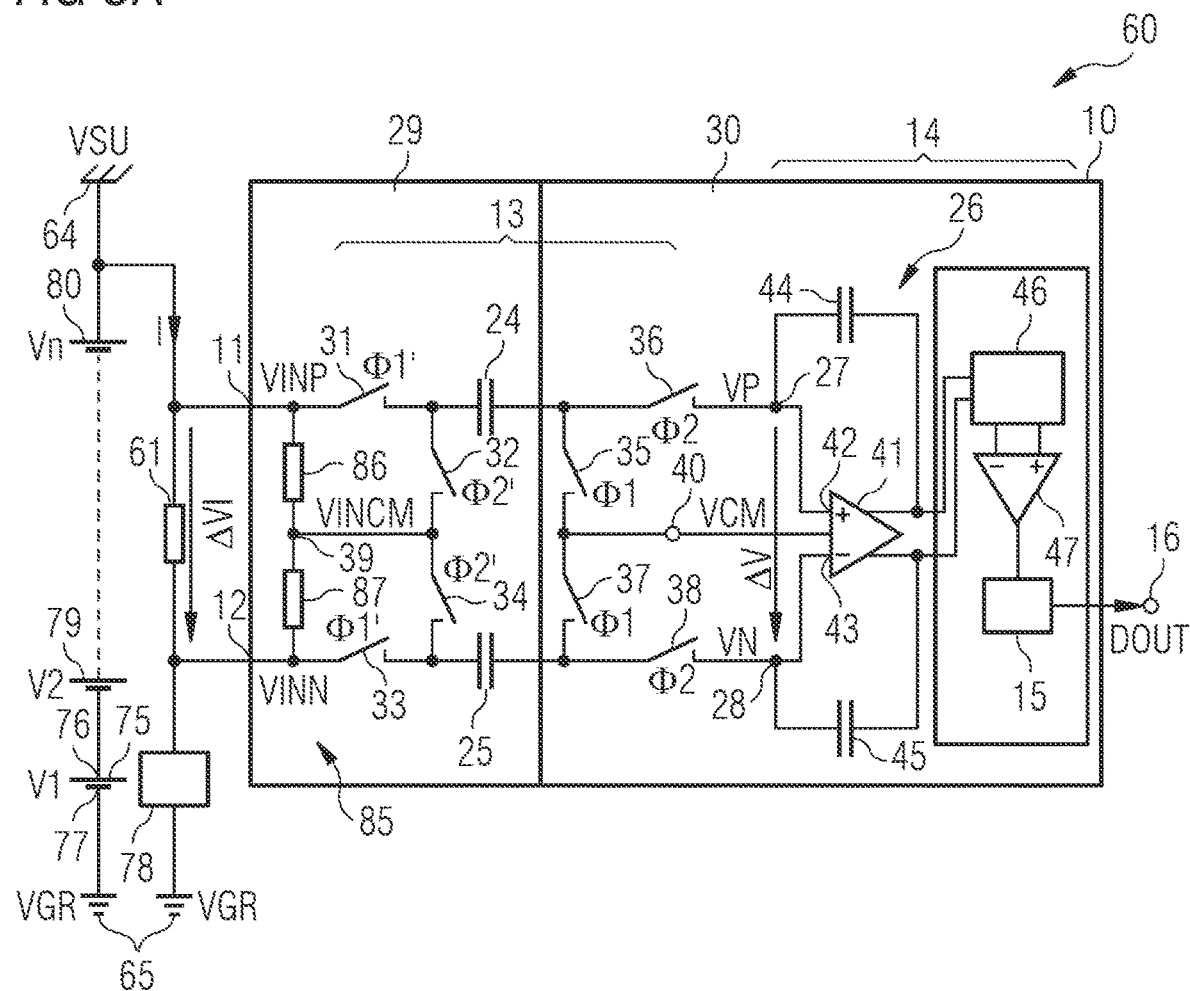
FIGS. 3A and 3B show further exemplary embodiments of a measurement arrangement.

FIG. 3A shows a further exemplary embodiment of the measurement arrangement 60 that is a further development of the above-shown embodiments. The measurement arrangement 60 comprises a first cell 75. A first terminal 76 of the first cell 75 is coupled via the resistive sensor 61 to a load 78. Thus, the first terminal 76 of the first cell 75 is coupled via a series circuit of the resistive sensor 61 and the load 78 to the reference potential terminal 65. A second terminal 77 of the first cell 75 is connected to the reference potential terminal 65.

There may be at least a second cell 79 arranged between the first cell 75 and the resistive sensor 61. Thus, the measurement arrangement 60 comprises a series circuit of a first number N of cells 75, 79, 80. A terminal of the last cell 80 of the series circuit of cells forms the supply voltage terminal 64. Thus, the supply voltage terminal 64 is not a connection to a further voltage source but is the connection to a terminal of the last cell 80 of the series circuit of cells. A battery comprises the series circuit of the first number N of cells 75, 79, 80.

The resistive sensor 61 is realized as a shunt sensor. Thus, the resistive sensor 61 is configured for measurement of the current I provided from the series circuit of cells 75, 79, 80 to the load 78. The AD converter 10 may comprise a resistive voltage divider 85 having a first and a second resistor 86, 87. The first resistor 86 couples the first input terminal 11 to the common mode terminal 39 and the second resistor 87 couples the common mode terminal 39 to the second input terminal 12. The resistive voltage divider 85 generates the input common mode voltage VINCM out of the first and the second input voltage VINP, VINN. Thus, the number of connection lines of the AD converter 10 with the resistive sensor 61 is only two and, therefore, kept low.

The measurement arrangement 60 is configured for a measurement of the current I flowing to the load 78. Positive and negative values of the current I can be detected by the measurement arrangement 60.

In FIG. 3A, an application diagram for bi-directional current sensor for a high-voltage (e.g. ~96 V) stacked-battery system is shown. The measurement arrangement 60 is implemented as a stacked battery measurement system where the load current measurement signal depends on the load profile. The measurement of the load current I is critical for the computation of the state of charge, abbreviated SOC, and the state of health, abbreviated SOH, for the battery stack 75, 79, 80.

In an alternative, not-shown embodiment, the resistive sensor 61 has a tap that is connected to the common mode terminal 39. Therefore, the resistive voltage divider 85 can be omitted. Thus, the resistive sensor 61 is realized such as shown in FIG. 2A. In this embodiment, the number of resistors is reduced.

Figure 3B:
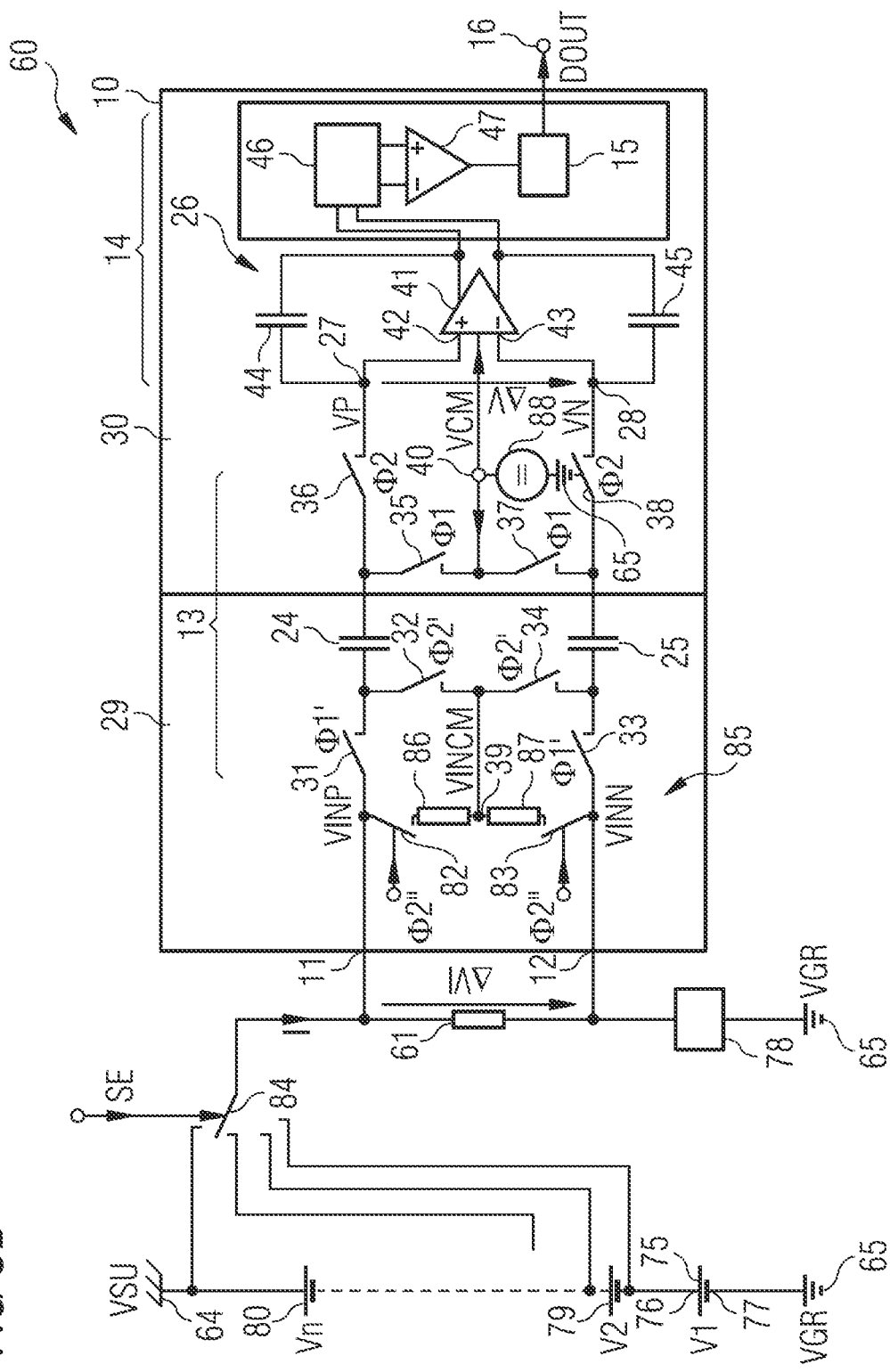

FIG. 3B shows a further exemplary embodiment of the measurement arrangement 60 that is a further development of the above-shown embodiments. The resistive voltage divider 85 comprises a divider switch 82. The divider switch 82 is arranged inside the resistive voltage divider 85 such that a current flow through the resistive voltage divider 85 can be switched off. Thus, the divider switch 82 may be arranged in series to the first resistor 86. For example, the divider switch 82 may couple the first input terminal 11 to the first resistor 86.

The resistive voltage divider 85 may comprise a further divider switch 83. The further divider switch 83 is arranged inside the resistive voltage divider 85 such that a current flow through the resistive voltage divider 85 can be switched off. Thus, the further divider switch 83 may be arranged in series to the second resistor 87. For example, the further divider switch 83 may couple the second input terminal 12 to the second resistor 87.

Figure 6:
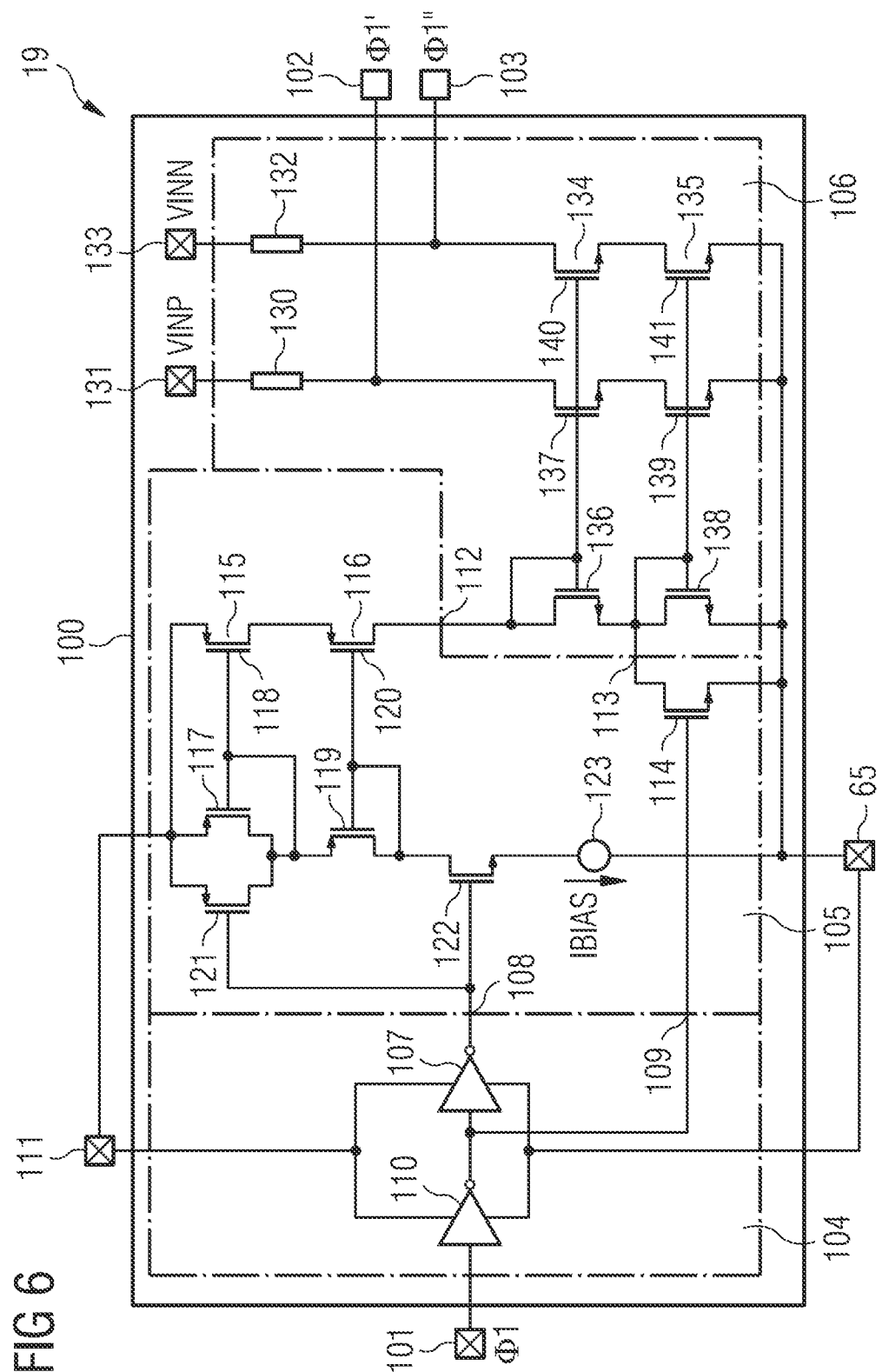
FIG. 6 shows an exemplary embodiment of a clock generator.

The divider switch 82 may be controlled by the further second signal Φ2' or a modified second signal Φ2" (as described in FIG. 6). The further divider switch 83 may be controlled by the further second signal Φ2' or the modified second signal Φ2" (as described in FIG. 6). Thus, the resistive voltage divider 85 generates the input common mode voltage VINCM, when the input common mode voltage VINCM is required. When the input common mode voltage VINCM is not required, the resistive voltage divider 85 is switched off and advantageously does not consume electrical power.

The measurement arrangement 60 comprises a change-over switch 84. An output of the change-over switch 84 is connected to the first input terminal 11. The inputs of the change-over switch 84 are coupled to different nodes of the series circuit of cells 75, 79, 80. For example, a first input of the change-over switch 84 may be connected to the first terminal 76 of the first cell 75. A second input of the change-over switch 84 may be connected to a first terminal of the second cell 79. A last input of the change-over switch 84 may be connected to a first terminal of the last cell 80. The change-over switch 84 is controlled by a selection signal SE. The selection signal SE determines the number of cells of the series circuit of cells 75, 79, 80 that are connected via the change-over switch 84 and the resistive sensor 61 to the load 78.

The AD converter 10 comprises a reference voltage source 88 connected to the amplifier common mode terminal 40. The reference voltage source 88 generates the amplifier common mode voltage VCM. The amplifier common mode voltage VCM is provided to the amplifier 41. The amplifier common mode voltage VCM is applied to an internal node of the amplifier 41.

Alternatively, the further divider switch 83 is omitted and is replaced by a connection line.

Alternatively, the divider switch 82 may be arranged in series to the second resistor 87. One switch inside the resistive voltage divider 85 is sufficient to interrupt the current flowing through the resistive voltage divider 85.

Figure 4A:
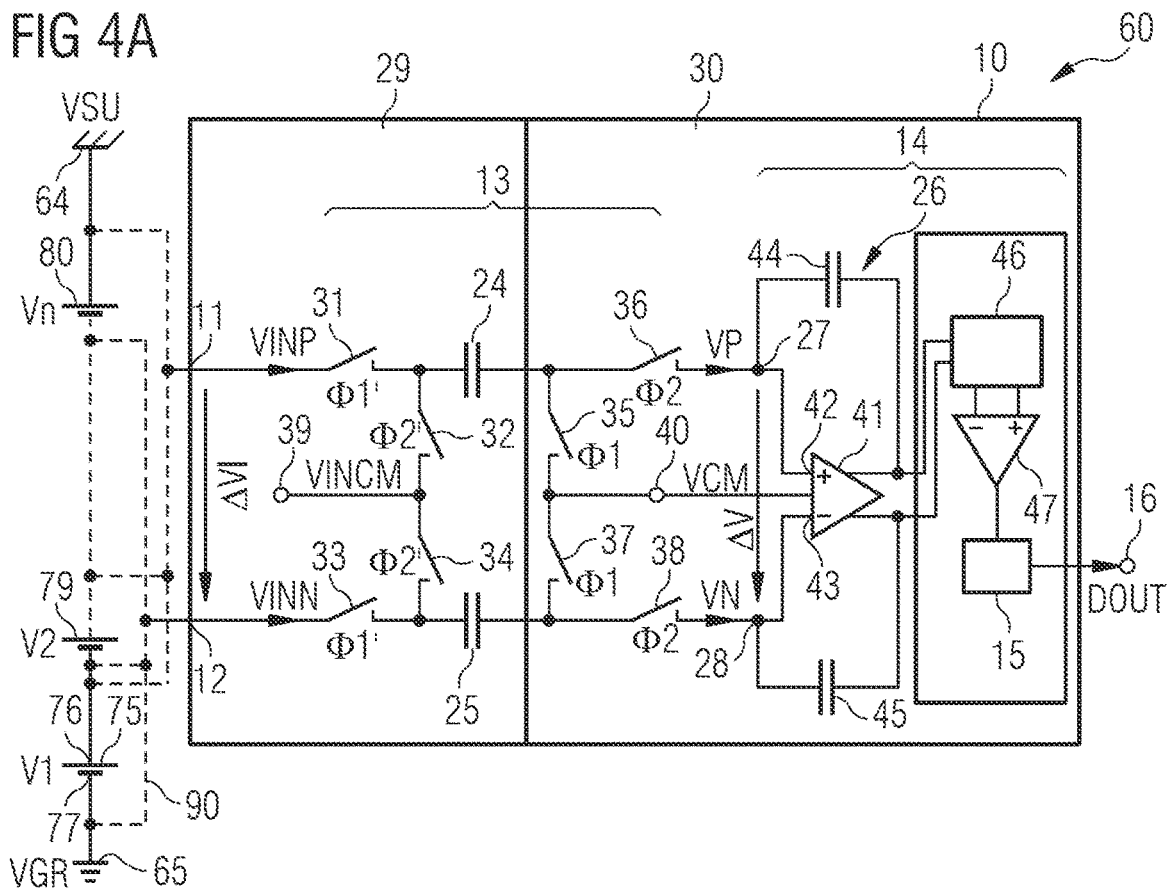
FIGS. 4A and 4B show further exemplary embodiments of a measurement arrangement.

FIG. 4A shows a further exemplary embodiment of the measurement arrangement 60 which is a further development of the above-shown embodiments. The measurement arrangement 60 comprises the first cell 75. The first input terminal 11 is coupled to the first terminal 76 of the first cell 75 and the second input terminal 12 is coupled to the second terminal 77 of the first cell 75. Thus, the AD converter 10 is configured for a measurement of a first cell voltage V1 provided by the first cell 75.

The second and the third cell 79, 80 may be connected in series to the first cell 75. Thus, the measurement arrangement 60 may comprise the series circuit of the first number N of cells 75, 79, 80. The measurement arrangement 60 may comprise a coupler 90. The coupler 90 may couple one cell of the series circuit of cells 75, 79, 80 to the first and the second input terminal 11, 12. Thus, the voltage across one cell of the series circuit of cells 75, 79, 80 is measured by the AD converter 10.

In FIG. 4A, the implementation of the voltage measurement of each cell 75, 79, 80 of a stacked battery is shown that is critical for the computation of the SOC and SOH for the battery. The application diagram shows that the input signal sampling can be applied for low-voltage sensor front-end and high-voltage applications like battery management and control.

Figure 4B:
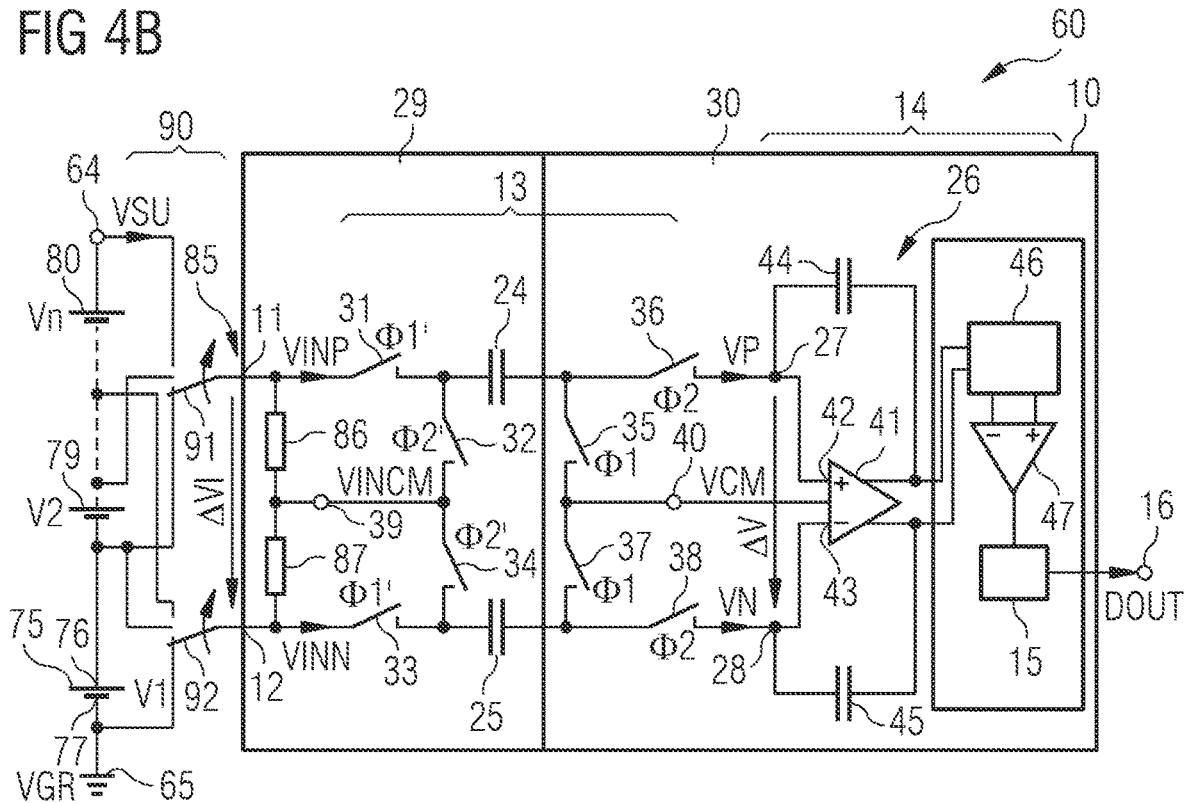

FIG. 4B shows a further exemplary embodiment of the measurement arrangement 60 which is a further development of the embodiments shown above. The AD converter 10 comprises the resistive voltage divider 85 as shown in FIGS. 3A and 3B. The coupler 90 comprises a first and a second changeover switch 91, 92. The first changeover switch 91 comprises one output connected to the first input terminal 11 and several inputs connected to the first terminals 76 of the cells of the series circuit of cells 75, 79, 80.

Correspondingly, the second changeover switch 92 comprises one output connected to the second input terminal 12 and several inputs connected to the second terminals 77 of the cells of the series circuit of cells 75, 79, 80.

Thus, the AD converter 10 is able to measure the cell voltages V1, V2, Vn of each of the cells 75, 79, 80 in a separate manner. Advantageously, also a last cell voltage Vn of the last cell (in the case of FIG. 4B the third cell 80) can be measured even in case the first and the second input voltage VINP, VINN have high absolute voltage values.

FIGS. 5A to 5D show exemplary characteristics of the AD converter 10 shown in FIG. 1C. The characteristics are simulation results. The signals are shown as a function of a time t. The lines marked with A show the first and the second integrator voltage VP, VN. The lines marked with B also show the first and the second integrator voltage VP, VN. In case of the lines marked with A, an embodiment of the analog-to-digital converter 10 shown in one of the Figures is used for simulation. The lines marked with B are the result of a simulation without an analog-to-digital converter 10 as described in one of the Figures. Additionally, the amplifier common mode voltage VCM, the first input signal VINP and the second input signal VINN are shown as a function of time t. These three signals are kept constant during each simulation.

Figure 5B:
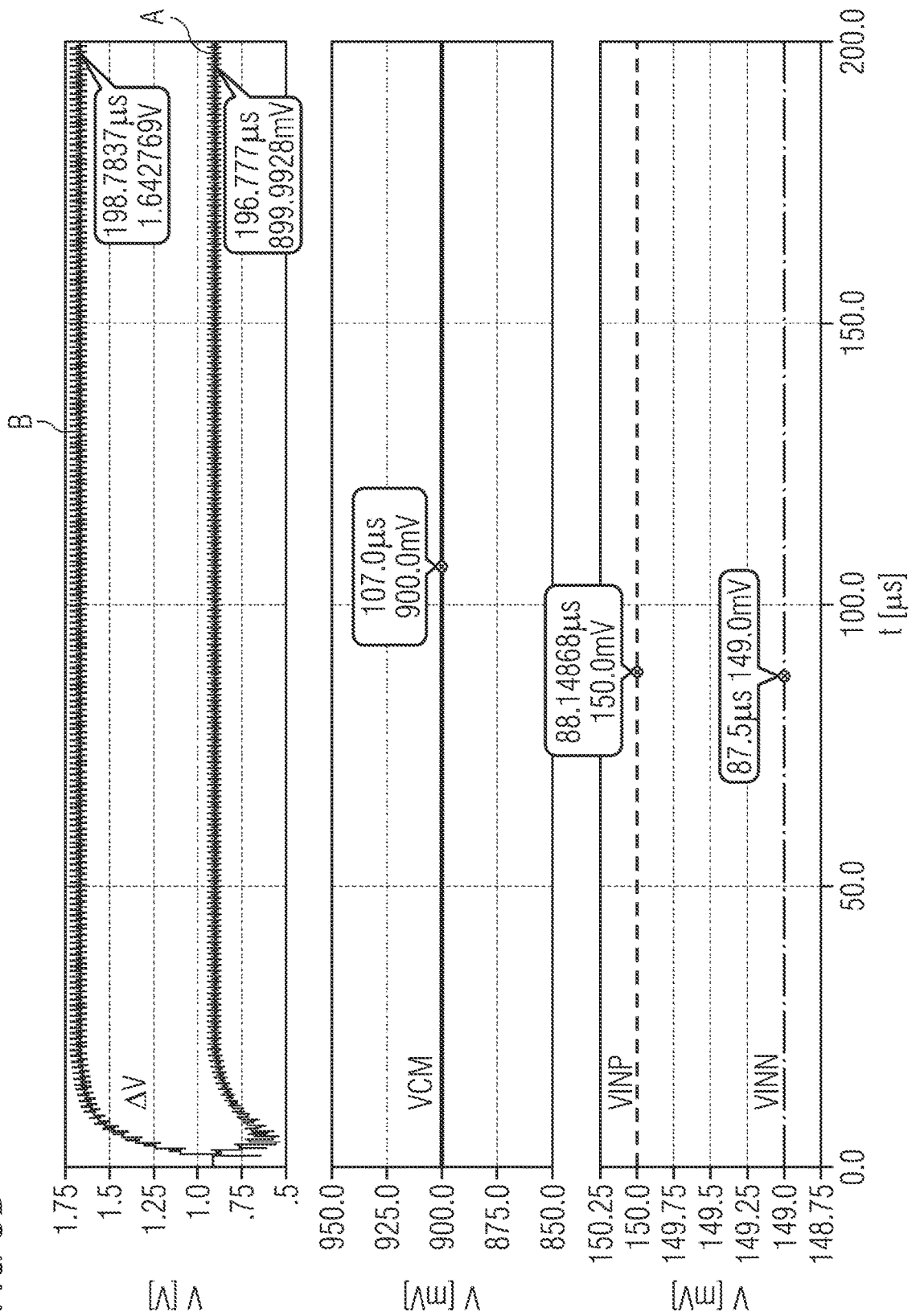

FIGS. 5A and 5B show an input common mode requirement for the SDM integrator 26 for rail-to-rail operation. The lines marked with A result if the input signal common mode is applied to the SC circuit 14. The line marked with B is achieved if the amplifier common mode is applied to the SC circuit 14. There are virtual ground nodes for the SDM integrator 26.

In FIG. 5A, the first input voltage VINP has a value of 1.8 V and the second input voltage VINN has a value of 1.799 V. The amplifier common mode voltage VCM has a value of 0.9 V. In FIG. 5A, for the standard architecture (marked with B) when the signal is close to the supply voltage VSU (1.8 V) and the further input common mode voltage VINCM=900 mV, signals at the virtual grounds of the SDM integrator 26 are very close to the reference potential VGR. However, for the signal common-mode sampling approach (marked with A), the inputs of the SDM integrator 26 are at around the amplifier common mode voltage VCM (900 mV). FIG. 5A shows the SDM integrator common mode for signal referred to the supply voltage VSU sampled using the reference input common-mode voltage VINCM versus the signal input common-mode.

In FIG. 5B, the first input voltage VINP has a value of 0.150 V and the second input voltage VINN has a value of 0.149 V. The amplifier common mode voltage VCM has a value of 0.9 V. In FIG. 5B, for the standard architecture (marked with B) when the signal is close to the ground potential VGR (~150 mV) and the further input common mode voltage VINCMX=900 mV, signals at the virtual grounds of the SDM integrator 26 are very close to the supply voltage VSU. However, for the signal common-mode sampling approach (marked with A), the inputs of the SDM integrator 26 are at around the amplifier common mode voltage VCM (900 mV). FIG. 5B shows the SDM integrator common mode for signal referred to the ground potential VGR (150 mV) sampled using the reference input common-mode voltage VINCMX versus the signal input common-mode.

Figure 5C:
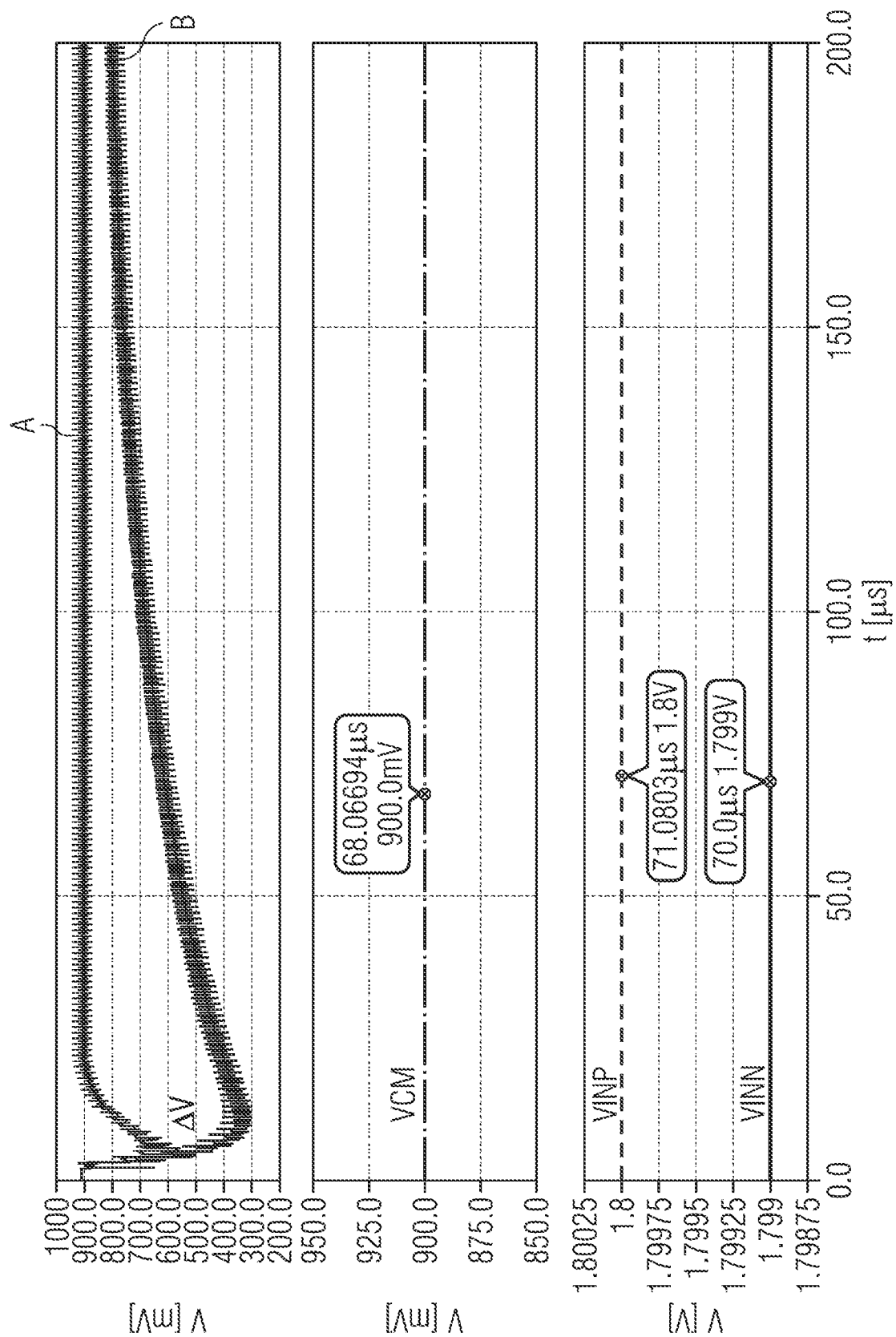

FIGS. 5C and 5D show a fast settling behavior using the signal common mode. The lines marked with A result if the input signal common mode is applied to the SC circuit 14. The lines marked with B are achieved without applying the input common mode to the SC circuit 14. There are virtual ground nodes for the SDM integrator 26.

In FIG. 5C, the first input voltage VINP has a value of 1.8 V and the second input voltage VINN has a value of 1.799 V. The amplifier common mode voltage VCM has a value of 0.9 V. In FIG. 5C, the signal is 1 mV referred to the supply voltage VSU=1.8 V. The line marked with B shows the steady-state settling at the inputs of the SDM integrator 26 for the floating-input common mode (the input common mode voltage VINCM in FIG. 1C is floating). The line marked with A shows the settling at the inputs of the SDM integrator 26 when the signal input-common mode from the resistive sensor 61 acting as shunt resistor is used. FIG. 5C shows the settling behavior for a signal referred to the supply voltage VSU at the input of the SDM 10 using the signal-common-mode sampling versus floating node.

In FIG. 5D, the first input voltage VINP has a value of 0.150 V and the second input voltage VINN has a value of 0.149 V. The amplifier common mode voltage VCM has a value of 0.9 V. The signal is 1 mV close to the ground potential VGR (~150 mV). The line marked with B shows the steady-state settling at the inputs of the SDM integrator 26 for the floating-input common mode (the further input common mode voltage VINCMX in FIG. 1C is floating). The line marked with A shows the settling at the inputs of the SDM integrator 26 when the signal input-common mode from the sensor that means from the further sampling arrangement 48 is used. FIG. 5D shows the settling behavior for a signal referred to the ground potential VGR at the input of the SDM 10 using the signal-common-mode sampling versus floating node.

The measurement arrangement 60 uses a high-voltage switched capacitor circuit 13 to sample the sense voltage VINP, VINN at higher input common mode voltage and for converting to a low voltage signal.

The second clock generator 19 is realized as a clock level shift circuit for level shifting the chopper and sampling clock signals Φ1, Φ2 to sample the high common mode on to the two sampling capacitors 24, 25. The second clock generator 19 is different from the first clock generator 18. The second clock generator 19 may be a level shifted version of the first clock generator 18. A supply voltage of the second clock generator 19 is a high voltage or is at the sensing signal voltage level, such as the level of the first and the second input voltage VINP, VINN.

A low-voltage NMOS chopper is placed in parallel to a high-voltage chopper to support the input common mode voltage VINCM and sense voltage close to ground (−1 V to 2 V).

The measurement arrangement 60 measures the sensor resistance that can be used to detect the sense element resistance Rshunt from the supply voltage VSU or the ground potential VGR.

The input signal common-mode sampling (the input common mode voltage VINCM or the further input common mode voltage VINCMX) ensures faster throughput, signal common-mode settling and relaxed ADC amplifier 41 input-stage common-mode requirements. This also maintains constant input common-mode for the amplifier 41 irrespective of the signal common-mode voltage.

The AD converter 10 that realizes the SDM can operate at lower OSR without RESET when one switches from one sensor measurement channel to another.

The circuit arrangement and sampling method uses time-division-multiplex (abbreviated TDM) to re-use the AD converter 10 for the multiple measurement channels on-chip. This allows the area optimization for multiple sensor measurement on-chip.

The measurement arrangement 60 measures the current I and/or resistance that can be used to detect the disconnection of the resistive/current sensor 61, 67. If there is a disconnection inside the measurement arrangement 60, the digital output signal DOUT is zero. If the first input terminal 11, the second input terminal 12 or the common mode terminal 39 are not connected to the predefined nodes of the measurement arrangement 60, the digital output signal DOUT has the value zero. By watching the digital output signal DOUT, the measurement arrangement 60 is able to determine whether the sensor has a problem or not.

A high measurement accuracy is achieved as there are no level-shifting amplifier to reduce the common mode level. The AD converter 10 is free of any voltage-level shifting amplifier.

The first to the eighth input switch 31 to 38 are fabricated as transistors, e.g. metal-oxide-semiconductor field-effect transistors, abbreviated MOSFETs. The first to the fourth input switch 31 to 34 are different from the fifth to the eighth input switch 35 to 38. The first to fourth input switch 31 to 34 are high voltage switches. The first to fourth input switch 31 to 34 are realized as high voltage transistors. The high voltage transistors may be for example capable for 50 V or 120 V. The first to fourth input switch 31 to 34 may be fabricated as p-channel MOSFETs.

The first and the second sampling capacitors 24, 25 are fabricated as high voltage capacitors. They may be realized as well capacitors, e.g. as n-well capacitors. For example they may be realized as high voltage capable special well capacitors.

FIG. 6 shows an exemplary embodiment of a clock generator that can be used in one of the above-shown embodiments of the AD converter 10 or the measurement arrangement 60. FIG. 6 shows a first block 100 of the second clock generator 19. The first input 101 of the second clock generator 19 is connected to the first output of the first clock generator 18. At the first output of the first clock generator 18 and thus at the first input 101 of the second clock generator 19, the first signal Φ1 is tapped. The second clock generator 19 comprises the first output 102. At the first output 102 of the second clock generator 19, the further first signal Φ1' is provided. The first output 102 of the second clock generator 19 is connected to the control terminal of the first input switch 31. The first block 100 comprises an input stage 104 connected on its input side to the first input 101, an intermediate stage 105 and an output stage 106 connected on its output side to the first output 102. The intermediate stage 105 couples the input stage 104 to the output stage 106. The input stage 104 and the intermediate stage 105 are part of the low voltage domain 30. The output stage 106 is part of the high voltage domain 29.

The input stage 104 comprises at least one inverter 107 coupled on its input side to the first input 101. An output of the first inverter 107 is connected to a first output 108 of the input stage 104. An input of the first inverter 107 is connected to a second output 109 of the input stage 104. The input stage 104 may comprise a second inverter 110 coupling the first input 101 of the second clock generator 19 to the input of the first inverter 107. Thus, the output of the second inverter 110 is connected to the second output 109 of the input stage 104. The second clock generator 19 comprises a further supply terminal 111. The further supply terminal 111 is connected to the supply terminals of the first and the second inverter 107, 110. Moreover, the first and the second inverter 107, 110 are connected to the reference potential terminal 65. For example a supply voltage of 5 V is provided at the further supply terminal 111. At the reference potential terminal 65, the ground potential VGR is tapped. A ground potential VGR may be 0 V.

The intermediate stage 105 couples the first and the second output 108, 109 of the input stage 104 to a first and second output 112, 113 of the intermediate stage 105. The intermediate stage 105 comprises a first coupling transistor 114 having a control terminal connected to the second output 109 of the input stage 104. A first terminal of the first coupling transistor 140 is connected to the second output 113 of the intermediate stage 105. A second terminal of the first coupling transistor 114 is connected to the reference potential terminal 65.

The intermediate stage 105 comprises a first and a second current mirror 115, 116. The first and the second current mirror 115, 116 are connected to each other in a cascode form. The first current mirror 115 comprises a first and a second current mirror transistor 117, 118 having first terminals connected to the further supply terminal 111. The control terminals of the first and the second current mirror transistor 117, 118 are connected to each other and to a second terminal of the first current mirror transistor 117. The second current mirror 116 comprises a third and a fourth current mirror transistor 119, 120. A first terminal of the fourth current mirror transistor 120 is connected to a second terminal of the second current mirror transistor 118. A second terminal of the fourth current mirror transistor 120 is connected to the second output 112 of the intermediate stage 105.

Correspondingly, a first terminal of the third current mirror transistor 119 is connected to the second terminal of the first current mirror 117. The control terminals of the third and the fourth current mirror transistor 119, 120 are connected to each other and to a second terminal of the third current mirror transistor 119. The intermediate stage 105 comprises a second coupling transistor 121 arranged in parallel to the first current mirror transistor 117. Thus, a first terminal of the second coupling transistor 121 is connected to the further supply terminal 111 and a second terminal of the second coupling transistor 121 is connected to the second terminal of the first current mirror transistor 117. A control terminal of the second coupling transistor 121 is connected to the first output 108 of the input stage 104.

The second terminal of the third mirror transistor 119 is coupled via a third coupling transistor 122 and a current source 123 to the reference potential terminal 65. Thus, the second terminal of the third mirror transistor 119 is connected to a first terminal of the third coupling transistor 122. A second terminal of the third coupling transistor 122 is coupled via the current source 123 to the reference potential terminal 65. The current source 123 provides a bias current IBIAS, e.g. 5 µA. A control terminal of the third coupling transistor 122 is connected to the first output 108 of the input stage 104.

The output stage 106 comprises a first pull-up resistor 130 that connects the first output 102 of the second clock generator 19 to a first supply terminal 131. The first supply terminal 131 is connected to the first input terminal 11. The first input voltage VINP is provided to the first supply terminal 131. The output stage 106 comprises a first and a second output current mirror 134, 135. The first and the second output current mirror 134, 135 are arranged in a cascode form. The first output current mirror 134 comprises a first and a second output transistor 136, 137. The first and the second output transistor 136, 137 are arranged as a current mirror. A control terminal of the first output transistor 136 is connected to a control terminal of the second output transistor 137 and to a first terminal of the first output transistor 136. The first terminal of the first output transistor 136 is connected to the first output 112 of the intermediate stage 105.

The second current mirror 135 comprises a third and a fourth output transistor 138, 139. The third and the fourth output transistor 138, 139 form a current mirror. A first terminal of the third output transistor 138 is connected to a second terminal of the first output transistor 136 and to the second output 113 of the intermediate stage 105. Thus, the second terminal of the first output transistor 136 is connected to the second output 113 of the intermediate stage 105. A first terminal of the fourth output transistor 139 is connected to a second terminal of the second output transistor 137. The control terminals of the third and the fourth output transistor 138, 139 are connected to each other and to the first terminal of the third output transistor 138. The second terminals of the third and the fourth output transistor 138, 139 are connected to the reference potential terminal 65. The first terminal of the second output transistor 137 is connected to the first pull-up resistor 130 and thus also to the first output 102 of the second clock generator 19.

The second clock generator 19 may comprise the additional first output 103. The additional first output 103 of the second clock generator 19 provides a modified first signal Φ1". The additional first output 103 of the second clock generator 19 is connected to the control terminal of the third input switch 33. Thus, the first block 100 of the second clock generator 19 comprises the first input 101, the first output 102 and also the additional first output 103. The output stage 106 is connected on its output side to the first output 102 and the additional first output 103. The output stage 106 comprises a second pull-up resistor 132 coupling the additional first output 103 to a second supply terminal 133. The second supply terminal 133 is connected to the second input terminal 12. The second input voltage VINN is provided to the second supply terminal 133.

In case the second clock generator 19 comprises the additional first output 103, the output stage 106 comprises a fifth and a sixth output transistor 140, 141. The fifth output transistor 141 is part of the first output current mirror 134. The fifth output transistor 140 is arranged such as the second output transistor 137. The second output current mirror 135 comprises the sixth output transistor 141. Thus, a control terminal of the fifth output transistor 140 is connected to a control terminal of the second output transistor 137. A control terminal of the sixth output transistor 141 is connected to the control terminal of the fourth output transistor 139. The first terminal of the fifth output transistor 140 is connected to the second pull-up resistor 132 and thus also to the additional first output 103 of the second clock generator 19. A second terminal of the fifth output transistor 140 is connected to a first terminal of the sixth output transistor 141. A second terminal of the sixth output transistor 141 is connected to the reference potential terminal 65.

The transistors of the intermediate stage 105 and of the output stage 106 are realized as metal-oxide-semiconductor field-effect transistors, abbreviated MOSFETs. The first coupling transistor 114 is realized as an n-channel MOSFET. The second coupling transistor 121 is implemented as a p-channel MOSFET. The third coupling transistor 122 is implemented as an n-channel MOSFET. The first to the fourth current mirror transistor 117 to 120 are fabricated as p-channel MOSFETs. The first and the second output mirror 134, 135 are fabricated using n-channel MOSFETs. Thus, the first to the fourth output transistor 136 to 139 are implemented as n-channel MOSFETs. Also the fifth and the sixth output transistor 140, 141 are realized as n-channel MOSFETs.

By the use of the first pull-up resistor 130, the further first signal Φ1' can obtain nearly the voltage value that can be tapped at the first supply terminal 131 and thus a high voltage value suitable for controlling the first input switch 31. Thus, the further first signal Φ1' can rise up to the first input voltage VINP. When the second and the fourth output transistor 137, 139 are set in a conducting state, the further first signal Φ1' drops nearly to the ground potential VGR. When the second and the fourth output transistor 137, 139 are set in a non-conducting state, the further first signal Φ1' rises due to current flowing through the first pull-up resistor 130 to the first output 102. Advantageously, the further first signal Φ1' can obtain high voltage values, whereas the first signal Φ1 obtains voltage values such as between 0 and 5 V or 0 and 3.3 V.

Correspondingly, by the use of the second pull-up resistor 132, the modified first signal Φ1" can obtain nearly the voltage value that can be tapped at the second supply terminal 133 and thus a high voltage value suitable for controlling the third input switch 33. Thus, the modified first signal Φ1" can rise up to the second input voltage VINN. The modified first signal Φ1" has the same pulses such as the further first signal Φ1' and the first signal Φ1. These three signals Φ1, Φ1' and Φ1" only differ in their height.

The second clock generator 19 comprises a second block that is realized such as the first block 100. The second block is not shown in FIG. 6. The second block of the second clock generator 19 couples the second input of the second clock generator 19 at which the second signal Φ2 is tapped to the second output of the second clock generator 19, at which the further second signal Φ2' can be tapped. Thus, the second signal Φ2 is applied to an input of the second block of the second clock generator 19. A first supply terminal of the second block is connected to the first input terminal 11. The first input voltage VINP is provided to the first supply terminal of the second block. A second supply terminal of the second block is connected to the second input terminal 12. The second input voltage VINN is provided to the second supply terminal of the second block. The second output of the second clock generator 19 is connected to the output side of the second block, provides the further second signal Φ2' and is connected to the control terminal of the second input switch 32. The additional second output of the second clock generator 19 is connected to the output side of the second block, provides a modified second signal Φ2" and is connected to the control terminal of the fourth input switch 34.

In FIG. 6, a block diagram of a level shifter is shown. The second clock generator 19 receives the signals from the first clock generator 18 and shifts the levels of the clock signals namely the further first signal Φ1' and the further second signal Φ2' to the sensing voltage levels VINP, VINN. The second clock generator 19 is realized as a level shifter or as a shuttling switch control level shifter.

In an alternative, not shown embodiment, the first supply terminal 131 of the first block 100 is connected to the supply voltage terminal 64. The second supply terminal 133 may be connected to the first supply terminal 131, the first input terminal 11 or the supply voltage terminal 64.

In an alternative, not shown embodiment, the first output 102 of the second clock generator 19 is connected to the control terminals of the first and the third input switch 31, 33. The second output 103 of the second clock generator 19 may be connected to the control terminals of the second and the fourth input switch 32, 34. This embodiment is shown e.g. in FIG. 1B. The additional first and second outputs 103 can be omitted, for example if the difference between the first and the second input voltage VINP, VINN is small.

The invention claimed is:

1. An analog-to-digital converter, comprising
   a first and a second sampling capacitor,
   a first integrator having a first and a second integrator input,
   a first and a second input switch that couple a first input terminal and a common mode terminal to a first electrode of the first sampling capacitor,
   a third and a fourth input switch that couple a second input terminal and the common mode terminal to a first electrode of the second sampling capacitor,
   a fifth and a sixth input switch that couple a second electrode of the first sampling capacitor to an amplifier common mode terminal and to the first integrator input, and
   a seventh and an eighth input switch that couple a second electrode of the second sampling capacitor to the amplifier common mode terminal and to the second integrator input.

2. The analog-to-digital converter according to claim 1, wherein the first integrator comprises
   an amplifier having a first amplifier input connected to the first integrator input and a second amplifier input connected to the second integrator input,
   a first integrating capacitor coupled to the first amplifier input and to a first amplifier output of the amplifier, and
   a second integrating capacitor coupled to the second amplifier input and to a second amplifier output of the amplifier.

3. The analog-to-digital converter according to claim 2, wherein the amplifier is connected to the amplifier common mode terminal.

4. The analog-to-digital converter according to claim 2, wherein the analog-to-digital converter comprises
   a second integrator coupled on its input side to the first and the second amplifier output,
   a comparator coupled on its input side to an output side of the second integrator and
   a filter coupled on its input side to the output side of the second integrator.

5. The analog-to-digital converter according to claim 1, wherein the analog-to-digital converter is configured as a sigma-delta modulator.

6. The analog-to-digital converter according to claim 1, wherein the analog-to-digital converter comprises
   a first clock generator having a first output connected to the fifth and the seventh input switch and a second output connected to the sixth and eighth input switch and
   a second clock generator having a first output connected to at least one of the first and the third input switch and a second output connected to at least one of the second and the fourth input switch.

7. The analog-to-digital converter according to claim 6, wherein the first and the second clock generator are coupled such that the first, third, fifth and seventh input switch receive a first logical signal and the second, fourth, sixth and eighth input switch receive a second logical signal.

8. The analog-to-digital converter according to claim 6,
wherein the first to the fourth input switch, the first and the second sampling capacitor and the second clock generator are configured to operate at a higher voltage level than the fifth to the eighth input switch and the first clock generator.

9. The analog-to-digital converter according to claim 6,
wherein the second clock generator comprises
an input stage connected on its input side to a first input of the second clock generator,
an intermediate stage and
an output stage connected on its output side to the first output of the second clock generator,
wherein the intermediate stage couples the input stage to the output stage.

10. The analog-to-digital converter according to claim 1,
wherein the analog-to-digital converter comprises a resistive voltage divider having a first resistor coupling the first input terminal to the common mode terminal and a second resistor coupling the common mode terminal to the second input terminal.

11. A measurement arrangement, comprising
an analog-to-digital converter,
a first cell and
a coupler coupling a first terminal of the first cell to a first input terminal and a second terminal of the first cell to a second input terminal,
wherein the analog-to-digital converter comprises
a first and a second sampling capacitor,
a first integrator having a first and a second integrator input,
a first and a second input switch that couple the first input terminal and a common mode terminal to a first electrode of the first sampling capacitor,
a third and fourth input switch that couple the second input terminal and the common mode terminal to a first electrode of the second sampling capacitor,
a fifth and a sixth input switch that couple a second electrode of the first sampling capacitor to an amplifier common mode terminal and to the first integrator input, and
a seventh and an eighth input switch that couple a second electrode of the second sampling capacitor to the amplifier common mode terminal and to the second integrator input.

12. The measurement arrangement according to claim 11,
wherein the measurement arrangement comprises at least a second cell and the coupler selectively couples
the first terminal of the first cell to the first input terminal and the second terminal of the first cell to the second input terminal or
a first terminal of the second cell to the first input terminal and a second terminal of the second cell to the second input terminal.

13. A measurement arrangement,
comprising an analog-to-digital converter and a resistive sensor having a first terminal connected to a first input terminal and a second terminal connected to a second input terminal,
wherein the analog-to-digital converter comprises
a first and a second sampling capacitor,
a first integrator having a first and a second integrator input,
a first and a second input switch that couple the first input terminal and a common mode terminal to a first electrode of the first sampling capacitor,
a third and a fourth input switch that couple the second input terminal and the common mode terminal to a first electrode of the second sampling capacitor,
a fifth and a sixth input switch that couple a second electrode of the first sampling capacitor to an amplifier common mode terminal and to the first integrator input, and
a seventh and an eighth input switch that couple a second electrode of the second sampling capacitor to the amplifier common mode terminal and to the second integrator input.

14. The measurement arrangement according to claim 13,
wherein the resistive sensor comprises a first and a second resistive element and a tap, and
wherein the first resistive element couples the first terminal of the resistive sensor to the tap of the resistive sensor, the second resistive element couples the tap of the resistive sensor to the second terminal of the resistive sensor and the tap of the resistive sensor is connected to the common mode terminal.

15. A method for analog-to-digital conversion, comprising
in a first phase, sampling a first difference between a first input voltage and an amplifier common mode voltage by a first sampling capacitor and sampling a second difference between a second input voltage and the amplifier common mode voltage by a second sampling capacitor, and
in a second phase, providing a first integrator voltage to a first integrator input of a first integrator by subtracting the first difference voltage from a input common mode voltage and providing a second integrator voltage to a second integrator input of the first integrator by subtracting the second difference voltage from the input common mode voltage, and
generating a digital output signal by digitizing an integrator difference voltage between the first integrator voltage and the second integrator voltage.

16. The method according to claim 15,
wherein a resistive voltage divider generates the input common mode voltage out of the first and the second input voltage.

* * * * *